United States Patent
Li et al.

(10) Patent No.: US 12,451,376 B2
(45) Date of Patent: Oct. 21, 2025

(54) WAFER BOAT TEMPORARY STORAGE DEVICE AND SEMICONDUCTOR PROCESSING DEVICE

(71) Applicant: BEIJING NAURA MICROELECTRONICS EQUIPMENT CO., LTD., Beijing (CN)

(72) Inventors: Jinlong Li, Beijing (CN); Jianguo Li, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 0 days.

(21) Appl. No.: 18/715,376

(22) PCT Filed: Nov. 24, 2022

(86) PCT No.: PCT/CN2022/133984
§ 371 (c)(1),
(2) Date: May 31, 2024

(87) PCT Pub. No.: WO2023/098555
PCT Pub. Date: Jun. 8, 2023

(65) Prior Publication Data
US 2025/0038015 A1    Jan. 30, 2025

(30) Foreign Application Priority Data

Dec. 3, 2021 (CN) .................. 202111474714.2

(51) Int. Cl.
*H01L 21/67* (2006.01)
*H01L 21/68* (2006.01)
*H01L 21/673* (2006.01)

(52) U.S. Cl.
CPC .. *H01L 21/67109* (2013.01); *H01L 21/67017* (2013.01); *H01L 21/68* (2013.01); *H01L 21/673* (2013.01)

(58) Field of Classification Search
CPC ......... H01L 21/67109; H01L 21/67017; H01L 21/673; H01L 21/68
(Continued)

(56) References Cited

U.S. PATENT DOCUMENTS

2019/0301018 A1    10/2019    De Ridder et al.
2021/0175101 A1    6/2021    Hu et al.

FOREIGN PATENT DOCUMENTS

CN    201440409 U    4/2010
CN    110323160 A    10/2019
(Continued)

OTHER PUBLICATIONS

The World Intellectual Property Organization (WIPO) International Search Report for PCT/CN2022/133984 Jan. 16, 2023 5 Pages (including translation).

*Primary Examiner* — Ronald P Jarrett
(74) *Attorney, Agent, or Firm* — ANOVA LAW GROUP, PLLC

(57) ABSTRACT

A wafer boat temporary storage device for temporarily storing a wafer boat in a semiconductor processing device includes two carrying platforms arranged oppositely and configured to carry two ends of the wafer boat in a length direction of the wafer boat, respectively. The wafer boat includes two positioning parts arranged at two ends in the length direction and spaced apart in a width direction of the wafer boat. Each carrying platform includes a first positioning structure and a second positioning structure. The first positioning structure is configured to make rolling contact with two sides of the two positioning parts at one end of the wafer boat that face toward or away from the two position- (Continued)

ing parts at the other end of the wafer boat in the length direction to perform alignment between the wafer boat and the wafer boat temporary storage device in the length direction.

15 Claims, 17 Drawing Sheets

(58) Field of Classification Search
USPC .................................................... 414/222.04
See application file for complete search history.

(56) References Cited

FOREIGN PATENT DOCUMENTS

| | | |
|---|---|---|
| CN | 110777364 A | 2/2020 |
| CN | 214123854 U | 9/2021 |
| CN | 113707586 A | 11/2021 |
| CN | 114188253 A | 3/2022 |
| TW | I739080 B | 9/2021 |

WAFER BOAT TEMPORARY STORAGE DEVICE AND SEMICONDUCTOR PROCESSING DEVICE

CROSS-REFERENCE TO RELATED APPLICATIONS

This application is a national phase entry of PCT Patent Application No. PCT/CN2022/133984, filed on Nov. 24, 2022, which claims the priority of Chinese Patent Application No. 202111474714.2, filed on Dec. 3, 2021, the entire contents of all of which are incorporated herein by reference.

TECHNICAL FIELD

The present disclosure generally relates to semiconductor processing device field and, more particularly, to a wafer boat temporary storage device in a semiconductor processing device and a semiconductor processing device.

BACKGROUND

Horizontal Plasma Enhanced Chemical Vapor Deposition (PECVD) equipment may deposit a silicon nitride film on a surface of a wafer under a high temperature condition. After high temperature reaction, a wafer boat may be used to carry the wafer, and the wafer boat needs to be cooled in a wafer boat temporary storage apparatus. After the wafer boat is cooled to close to room temperature, a robot arm may be used to operate the wafer boat to unload the wafer.

When the wafer boar is temporarily stored in an existing wafer boat temporary storage apparatus, a positioning surface of a positioning structure of the wafer boat temporary storage apparatus will first make sliding contact with a positioning surface of a positioning part of the wafer boat to determine a position of the wafer boat relative to the wafer boat temporary storage apparatus. A load platform of the wafer boat temporary storage apparatus contacts both ends of the wafer boat to anchor the wafer boat on the wafer boat temporary storage apparatus. Then a cooling component of the wafer boat temporary storage apparatus blows cold air to the wafer boat to cool the wafer boat.

However, the positioning structure of the wafer boat temporary storage apparatus is in a surface-to-surface sliding contact with the positioning part of the wafer boat. Most wafer boats are made of graphite. When the positioning structure of the wafer boat temporary storage apparatus is in contact with the positioning part of the wafer boat, graphite particles may be rubbed off from the positioning part of the wafer boat made of graphite by the positioning structure of the wafer boat temporary storage apparatus. When the cooling component blows the cold air to the wafer boat, the rubbed-off graphite particles will be blown toward the wafer boat to contaminate a wafer carried by the wafer boat with the graphite particles, thereby resulting in poor wafer cleanliness.

SUMMARY

The present disclosure aims to solve at least one of the technical problems existing in the prior art and provides a wafer boat temporary storage device and a semiconductor processing device, which can reduce contamination on a wafer and improve cleanliness of the wafer.

The present disclosure also provides a wafer boat temporary storage device for temporarily storing a wafer boat in a semiconductor processing device. The wafer boat temporary storage device includes two carrying platforms arranged oppositely and configured to carry two ends of the wafer boat in a length direction of the wafer boat, respectively. The wafer boat includes two positioning parts arranged at two ends in the length direction and spaced apart in a width direction of the wafer boat. Each carrying platform includes a first positioning structure and a second positioning structure. The first positioning structure is configured to make rolling contact with two sides of the two positioning parts at one end of the wafer boat that face toward or away from the two positioning parts at the other end of the wafer boat in the length direction to perform alignment between the wafer boat and the wafer boat temporary storage device in the length direction. The second positioning structure is configured to make rolling contact with two sides of the two positioning parts at one end of the wafer boat that face toward or away from each other in the length direction to perform alignment between the wafer boat and the wafer boat temporary storage device in the width direction.

In some embodiments, in a direction in which the two carrying platforms face toward each other, a distance between the two first positioning structures is smaller than a distance between two second positioning structures. The first positioning structure is configured to make rolling contact with two sides of the two positioning parts at one end of the wafer boat that face toward the two positioning parts at the other end of the wafer boat in the length direction. The second positioning structure is configured to make rolling contact with two sides of the two positioning parts at one end of the wafer boat that face toward each other in the length direction.

In some embodiments, the first positioning structure includes two first rollers arranged apart in a direction perpendicular to the direction in which the two carrying platforms face toward each other. The two first rollers are rotatably connected to the carrying platform around the direction perpendicular to the direction in which the two carrying platforms face toward each other to make respective rolling contact with the two sides of the two positioning parts at one end of the wafer boat that face toward the two positioning parts at the other end of the wafer boat in the length direction.

In some embodiments, the first positioning structure further includes two first connection parts and two first rotation shafts. The two first connection parts are connected to the carrying platforms and are arranged apart in the direction perpendicular to the direction in which the two carrying platforms face toward each other. The two first rotation shafts are arranged to penetrate the two first connection parts, and an axial direction of each first rotation shaft is perpendicular to the direction in which the two carrying platforms face toward each other. The two first rollers are rotatably around axes of the two first rotation shafts and sleeved on the two first rotation shafts respectively.

IN some embodiments, the second positioning structure includes two second rollers arranged apart in the direction perpendicular to the direction in which the two carrying platforms face toward each other. The two first rollers are rotatably connected to the carrying platform around the direction perpendicular to the direction in which the two carrying platforms face toward each other to make respective rolling contact with the two sides of the two positioning parts at one end of the wafer boat that face toward or away from each other in the length direction.

In some embodiments, the second positioning structure further includes two second connection parts and two second rotation shafts. The two second connection parts are connected to the carrying platforms and are arranged apart in the direction perpendicular to the direction in which the two carrying platforms face toward each other. The two second rotation shafts are arranged to penetrate the two second connection parts, and an axial direction of each second rotation shaft is parallel to the direction in which the two carrying platforms face toward each other. The two second rollers are rotatably around axes of the two second rotation shafts and sleeved on the two second rotation shafts respectively.

In some embodiments, the second positioning structure further includes two second connection parts and two second rotation shafts. Each carrying platform includes a first threaded connection hole. Each second connection part includes a long connection hole. A long axis of the long connection hole is perpendicular to the direction in which the two carrying platforms face toward each other. The second positioning structure further includes a first threaded connection part. The first threaded connection part passes through the connection long hole and is threadedly connected to the first threaded connection hole. The first threaded connection part adjusts its relative position with the corresponding carrying platform in the direction perpendicular to the direction in which the two carrying platforms face toward each other by adjusting its relative position with the long connection hole in the long axis direction.

In some embodiments, the wafer boat temporary storage device further includes: two first support columns; two first support plates; and two second support plates. Axes of the two first support columns are parallel with each other. The two first support plates are respectively connected to the two first support columns. Axes of the two first support plates that are perpendicular to surfaces of the two first support plates are perpendicular to the axes of the two first support columns respectively. The two second support plates are respectively connected to the two first support plates. Axes of the two second support plates that are perpendicular to surfaces of the two second support plates are perpendicular to the axes of the two first support plates that are perpendicular to the surfaces of the two first support plates respectively, and are perpendicular to axes of the first support columns respectively. The two carrying platforms are respectively connected to the two second support plates.

In some embodiments, the wafer boat temporary storage device further includes: an adjustment shaft; a first fixing part; and a second fixing part. The first fixing part is connected to the second support plate, and is detachably connected to the second fixing part. The first fixing part and the second fixing part include a first groove and a second groove respectively. The first groove and the second groove are coordinated to form an adjustment hole. An axial direction of the adjustment hole is parallel to the direction in which the two carrying platforms face toward each other. The adjustment shaft is connected to the corresponding carrying platform, and penetrates the adjustment hole. The adjustment shaft adjusts a distance between the two carrying platforms by adjusting its relative position with the adjustment hole in the direction parallel to the direction in which the two carrying platforms face toward each other.

In some embodiments, a height difference compensator is configured on the carrying platforms. The height difference compensator is disposed on one of the carrying platforms. An upper surface of the height difference compensator is higher than an upper surface of the carrying platform.

In some embodiments, the wafer boat temporary storage device further includes: a detection part disposed at the first support plate and is used to detect whether any wafer boat is carried on the carrying platforms; and a preset heat insulation distance is provided between the detection part and the wafer boat carried on the carrying platforms.

In some embodiments, the wafer boat temporary storage device further includes: a liquid cooling part; an air cooling part; and a filter part. The liquid cooling part is used to cool ambient air. The air cooling part is arranged closer to the carrying platforms than the liquid cooling part, and is used to blow the ambient air cooled by the liquid cooling part to the wafer boat carried on the carrying platforms. The filter part is disposed between the liquid cooling part and the air cooling part to filter the ambient air blown by the air cooling part to the wafer boat carried on the carrying platforms.

In some embodiments, the air cooling part includes a fan and a support frame. The fan is disposed above the support frame for blowing the ambient air cooled by the liquid cooling part toward the wafer boat carried on the carrying platforms. The support frame includes an accommodation slot under the support frame for accommodating the filter part. The support frame includes ventilation vents connected to the fan and the accommodation slot respectively. The accommodation slot includes a first retrieval opening for retrieving the filter part.

In some embodiments, the number of fans is multiple, multiple fans are divided into multiple fan groups, and each fan group includes at least one fan. The number of the support frames is also multiple, the air cooling part also include a second support frame, and multiple fan groups are arranged on multiple support frames in one-to-one correspondence. The second support frame includes multiple installation spaces for installing multiple support frames inside in one-to-one correspondence. The second support frame includes multiple second retrieval openings that are connected to multiple installation spaces and multiple first retrieval openings in one-to-one correspondence, and each second retrieval opening is used for retrieving the filter part.

In some embodiments, the air cooling part also includes a fan protection part. The fan protection part covers the top of the fan. The fan protection part includes exposure openings for exposing the fans.

In some embodiments, the liquid cooling part includes a liquid cooling body, a liquid cooling bracket, a liquid inlet pipe, and a liquid outlet pipe. The liquid cooling body and the liquid cooling bracket are connected. The liquid inlet pipe is connected to the liquid cooling body for supplying a cooling liquid to the liquid cooling body. The liquid outlet pipe is connected to the liquid cooling body for draining a heated cooling liquid from the liquid cooling body.

Another aspect of the present disclosure provides a semiconductor processing device. The semiconductor device includes the disclosed wafer boat temporary storage device. The wafer boat temporary storage device is used to temporarily the wafer boat.

The present disclosure includes the following beneficial effects.

In the wafer boat temporary storage device of the semiconductor processing device provided by the embodiments of the present disclosure, when the wafer boat is moved to the wafer boat temporary storage device, the first positioning structure disposed at each carrying platform makes rolling contact with the two sides of the two positioning parts at one end of the wafer boat that face toward the two positioning parts at the other end of the wafer boat in the length direction or the two sides of the two positioning parts at one end of the wafer boat that face away from the two positioning parts at the other end of the wafer boat in the length direction. The two first positioning structures disposed on the two carrying platforms perform the alignment between the two wafer boats and the wafer boat temporary storage device in the length direction. The second positioning structure disposed at each carrying platform makes rolling contact with the two sides of the two positioning parts that face toward each other at one end of the wafer boat in the length direction or the two sides of the two positioning parts that face away from each other at one end of the wafer boat in the length direction. The two second positioning structures disposed on the two carrying platforms perform the alignment between the two wafer boats and the wafer boat temporary storage device in the width direction. Thus, the wafer boats are aligned with the wafer boat temporary storage device. The two wafer boats are carried respectively by two oppositely arranged ends of each of the two carrying platforms in the length direction of the wafer boat. In some embodiments, in an alignment process of the wafer boats and the wafer boat temporary storage device, the first positioning structure and the second positioning structure of each of the two carrying platforms make rolling contact with the positioning parts of each wafer boat. The rolling contact between the first positioning structure and the positioning parts of the wafer boat and the rolling contact between the second positioning structure and the positioning parts of the wafer boat reduce friction between the first positioning structure and the positioning parts of the wafer boat and friction between the second positioning structure and the positioning parts of the wafer boat respectively as compared with sliding contact between the first positioning structure and the positioning parts of the wafer boat and sliding contact between the second positioning structure and the positioning parts of the wafer boat. As such, particle contaminants generated by the friction between the first positioning structure and the positioning part of the wafer boat and the friction between the second positioning structure and the positioning part of the wafer boat can be reduced. When the wafer boats are air cooled, wafers carried by the wafer boats may be less contaminated, thereby improving wafer cleanliness.

The semiconductor processing device provided by the present disclosure can temporarily store the wafer boat by means of the wafer boat temporary storage device provided by the present disclosure, thereby reducing the contamination on the wafer and improving the cleanliness of the wafer

DETAILED DESCRIPTION OF THE EMBODIMENTS

To enable those skilled in the art to better comprehend the technical solutions of the present disclosure, a wafer boat temporary storage apparatus and a semiconductor processing device provided by the present disclosure will be described in detail below in conjunction with the accompanying drawings.

Figure 1:
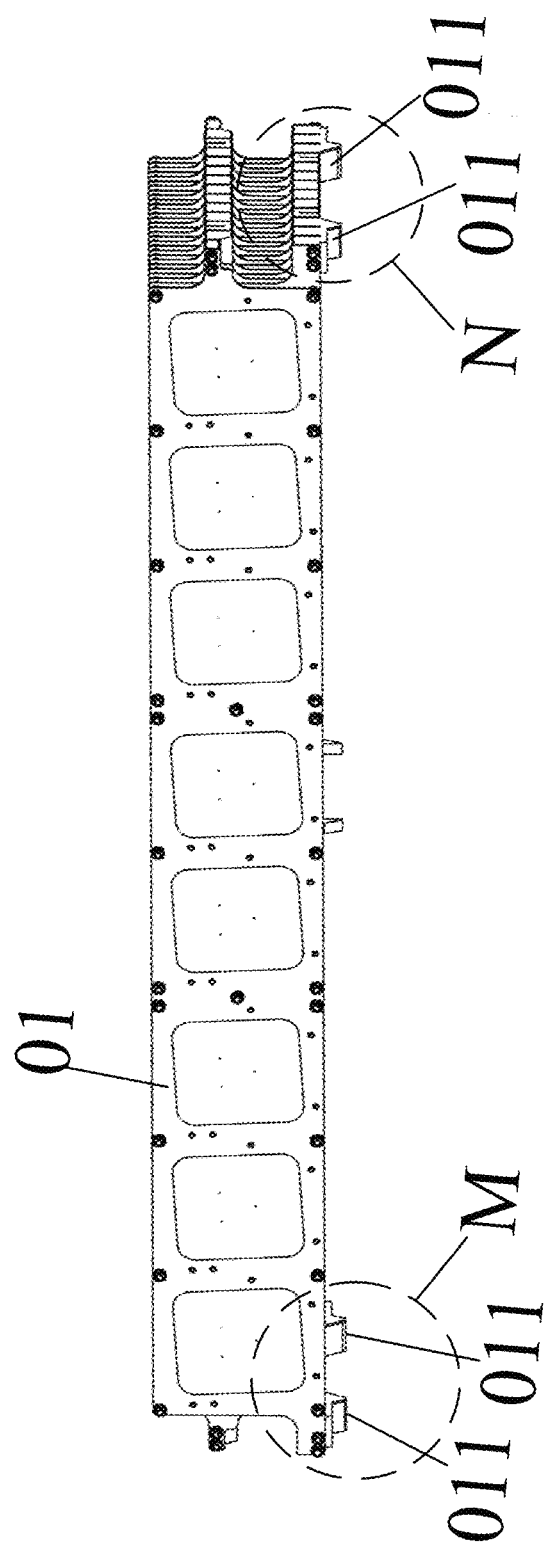
FIG. 1 is a schematic structural diagram of a wafer boat to be stored in a wafer boat temporary storage apparatus in a semiconductor processing device according to some embodiments of the present disclosure.
Figure 2:
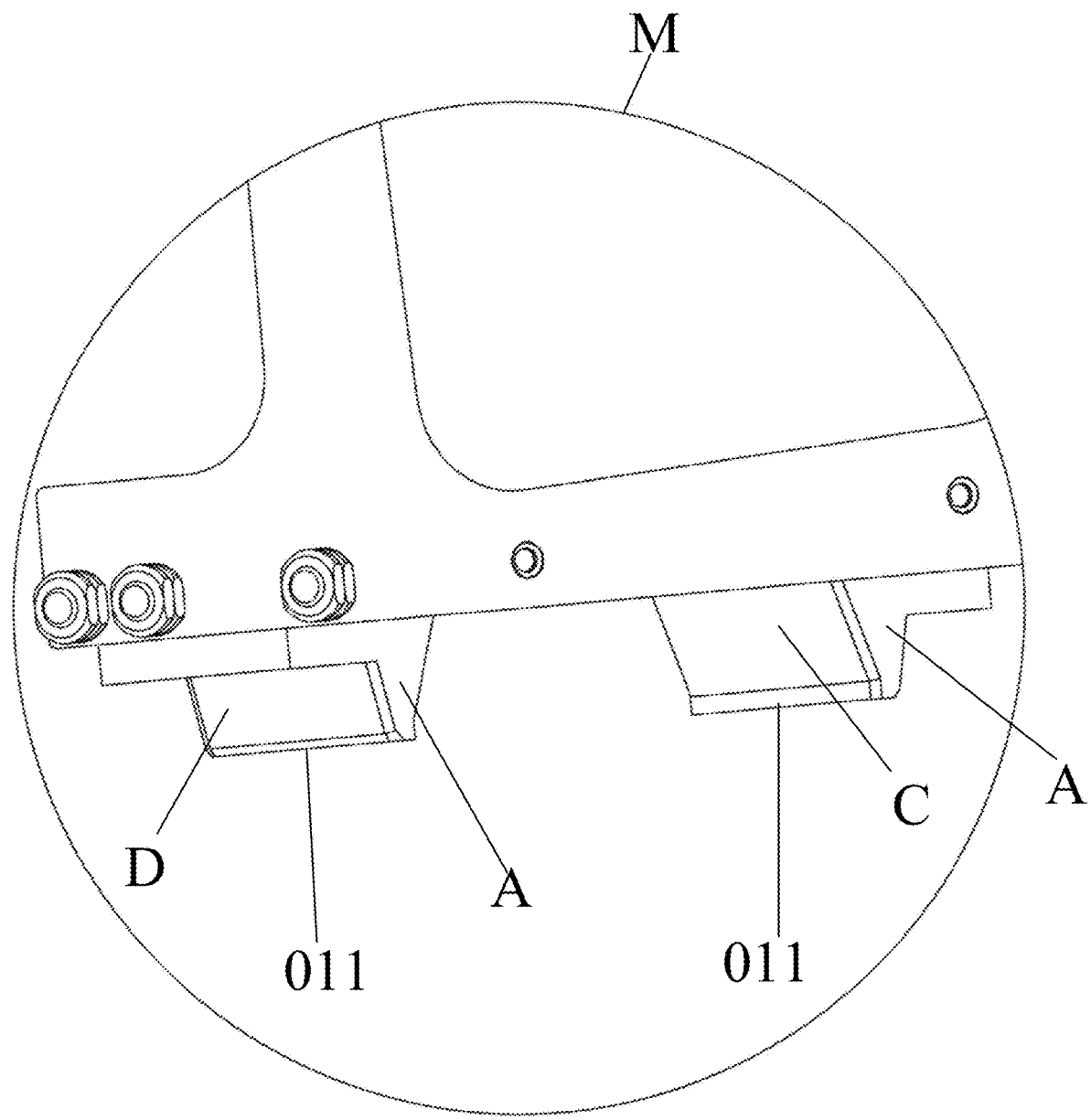
FIG. 2 is a schematic diagram of a partially enlarged structure at M in FIG. 1.
Figure 3:
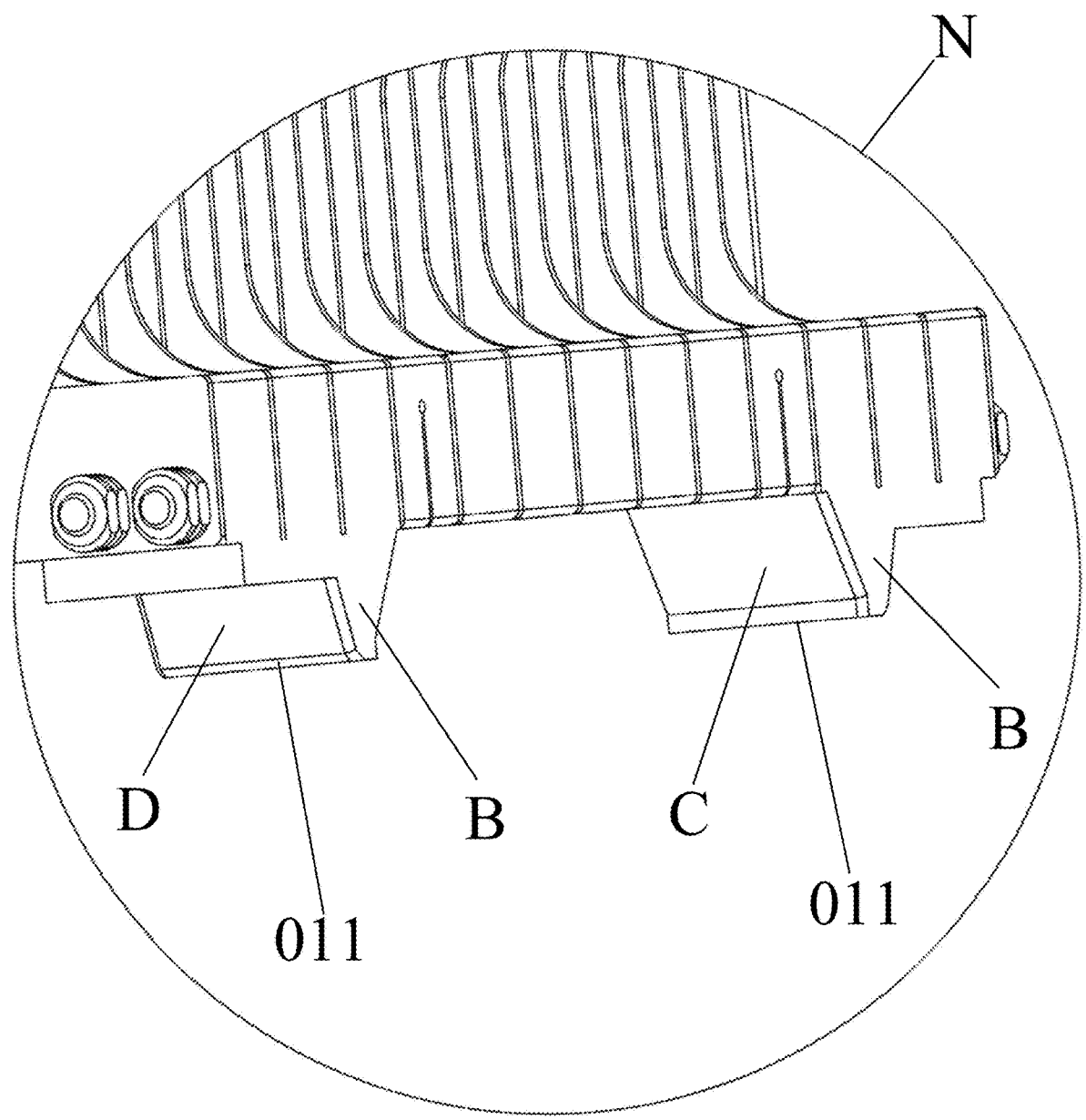
FIG. 3 is a schematic diagram of a partially enlarged structure at N in FIG. 1.

As shown in FIGS. 1 to 3, the present disclosure provides a wafer boat 01 that can be temporarily stored in a wafer boat temporary storage device of a semiconductor processing device. The wafer boat 01 is disposed in a length direction thereof and is anchored at both ends. The wafer boat 01 includes two positioning parts 011 at each end, which are spaced apart in a width direction of the wafer boat 01. That is, the wafer boat 01 includes two positioning parts 011 at one end in the length direction, and two more positioning parts 011 at the other end in the length direction. The two positioning parts 011 disposed at one end of the wafer boat 01 in the length direction are spaced apart in the width direction of the wafer boat 01, and the two positioning parts 011 disposed at the other end are also spaced apart in the width direction of the wafer boat 01. The wafer is carried in a portion between the two ends of the wafer boat 01 equipped with the positioning parts 011 in the length direction.

In some embodiments, as shown in FIG. 2, in the length direction of the wafer boat 01, side A of each of the two positioning parts 011 at one end faces toward the two positioning parts 011 at the other end. As shown in FIG. 3, side B of each of the two positioning parts 011 at one end of the wafer boat 01 faces away from the two positioning parts 011 at the other end. That is, side A and side B face away from each other. As shown in FIGS. 2 and 3, side C of one of the two positioning parts 011 at both ends of the wafer boat 01 in the length direction faces toward side C of the other of the two positioning parts 011. As shown in FIGS. 2 and 3, side D of one of the two positioning parts 011 at a same end of the wafer boat 01 in the length direction faces away from side D of the other of the two positioning parts 011 at the same end. That is, side C and side D face away from each other. In some embodiments, each positioning part 011 is a four-sided pyramid including four sides A-D. Side C and side D intersect and form an angle. Side A and side B are parallel to each other.

Figure 4:
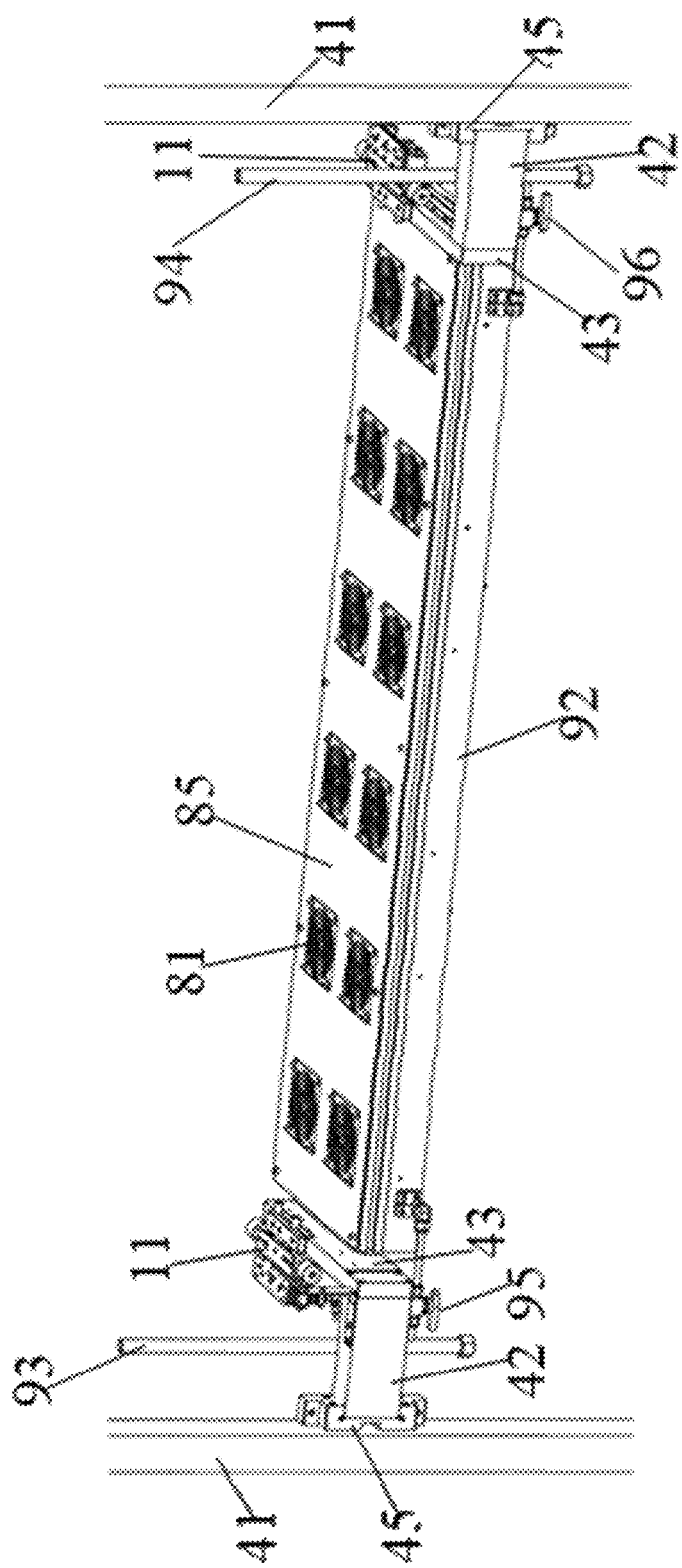
FIG. 4 is a schematic structural diagram of a wafer boat temporary storage apparatus in a semiconductor processing device according to some embodiments of the present disclosure.

As shown in FIG. 4, the present disclosure provides a wafer boat temporary storage device of a semiconductor processing device for temporarily storing a wafer boat 01. The wafer boat 01 includes two positioning parts 011 at both ends in its length direction. The two positioning parts 011 at each end are spaced apart in the width direction of the wafer boat 01. The wafer boat temporary storage device includes two oppositely arranged carrying platforms 11, which are used to respectively carry the two ends of the wafer boat 01 in its length direction. The wafer boat temporary storage device further includes a first positioning structure and a second positioning structure provided on each carrying platform 11. The first positioning structure and the second positioning structure disposed at a same carrying platform 11 are arranged to form an angle, to temporarily store the wafer boat 01 and perform alignment of the two positioning parts 011 at each end. The first positioning structure and the second positioning structure disposed at the same carrying platform 11 may be arranged perpendicular to each other. The first positioning structure makes rolling contact with two sides of each of the two positioning parts 011 at one end that face toward and away from the two positioning parts 011 at the other end in the length direction of the wafer boat 01 to perform the alignment between the wafer boat 01 and the wafer boat temporary storage device in the length direction of the wafer boat 01. The second positioning structure makes rolling contact with two sides of one of the two positioning parts 011 at a same end that face toward and away from two sides of the other of the two positioning parts 011 at the same end in the length direction of the wafer boat 01 to perform the alignment between the wafer boat 01 and the wafer boat temporary storage device in the width direction of the wafer boat 01.

Specifically, the first positioning structure is used to make rolling contact with two sides of the two positioning parts 011 at one end of the wafer boat 01 that face toward the two positioning parts 011 at the other end of the wafer boat 01 in the length direction. That is, as shown in FIG. 2, the first positioning structure makes rolling contact with side A of each of the two positioning parts 011. Alternatively, the first positioning structure is used to make rolling contact with two sides of the two positioning parts 011 at one end of the wafer boat 01 that face away from the two positioning parts 011 at the other end of the wafer boat 01 in the length direction. That is, as shown in FIG. 3, the first positioning structure makes rolling contact with side B of each of the two positioning parts 011. Through the above arrangement, the first positioning structure performs the alignment between the wafer boat 01 and the wafer boat temporary storage device in the length direction.

The second positioning structure is used to make rolling contact with two sides of the two positioning parts 011 that face toward each other at one end of the wafer boat 01 in the length direction. That is, as shown in FIGS. 2 and 3, the second positioning structure makes contact with side C of each of the two positioning parts 011. Alternatively, the second positioning structure is used to make rolling contact with two sides of the two positioning parts 011 that face away from each other at one end of the wafer boat 01 in the length direction. That is, as shown in FIGS. 2 and 3, the second positioning structure makes contact with side D of each of the two positioning parts 011. Through the above arrangement, the second positioning structure performs the alignment between the wafer boat 01 and the wafer boat temporary storage device in the width direction.

In the wafer boat temporary storage device of the semiconductor processing device provided by the embodiments of the present disclosure, when the wafer boat 01 is moved to the wafer boat temporary storage device, the first positioning structure disposed at each carrying platform 11 makes rolling contact with the two sides of the two positioning parts 011 at one end of the wafer boat 01 that face toward the two positioning parts 011 at the other end of the wafer boat 01 in the length direction or the two sides of the two positioning parts 011 at one end of the wafer boat 01 that face away from the two positioning parts 011 at the other end of the wafer boat 01 in the length direction. The two first positioning structures disposed on the two carrying platforms 11 perform the alignment between the two wafer boats 01 and the wafer boat temporary storage device in the length direction. The second positioning structure disposed at each carrying platform 11 makes rolling contact with the two sides of the two positioning parts 011 that face toward each other at one end of the wafer boat 01 in the length direction or the two sides of the two positioning parts 011 that face away from each other at one end of the wafer boat 01 in the length direction. The two second positioning structures disposed on the two carrying platforms 11 perform the alignment between the two wafer boats 01 and the wafer boat temporary storage device in the width direction. Thus, the wafer boats 01 are aligned with the wafer boat temporary storage device. The two wafer boats 01 are carried respectively by two oppositely arranged ends of each of the two carrying platforms 11 in the length direction of the wafer boat 01. In some embodiments, in an alignment process of the wafer boats 01 and the wafer boat temporary storage device, the first positioning structure and the second positioning structure of each of the two carrying platforms 11 make rolling contact with the positioning parts 011 of each wafer boat 01. The rolling contact between the first positioning structure and the positioning parts 011 of the wafer boat 01 and the rolling contact between the second positioning structure and the positioning parts 011 of the wafer boat 01 reduce friction between the first positioning structure and the positioning parts 011 of the wafer boat 01 and friction between the second positioning structure and the positioning parts 011 of the wafer boat 01 respectively as compared with sliding contact between the first positioning structure and the positioning parts 011 of the wafer boat 01 and sliding contact between the second positioning structure and the positioning parts 011 of the wafer boat 01. As such, particle contaminants generated by the friction between the first positioning structure and the positioning part 011 of the wafer boat 01 and the friction between the second positioning structure and the positioning part 011 of the wafer boat 01 can be reduced. When the wafer boats 01 are air cooled, wafers carried by the wafer boats 01 may be less contaminated, thereby improving wafer cleanliness.

In other words, when the wafer boat 01 is moved to the wafer boat temporary storage device provided by the embodiments of the present disclosure for temporary storage, the two sides of the two positioning parts 011 at one end of the wafer boat 01 in the length direction facing toward or away from the two positioning parts 011 at the other end of the wafer boat 01 make rolling contact with the first positioning structure disposed at one of the two carrying platforms 11. The two sides of the two positioning parts 011 at the other end of the wafer boat 01 in the length direction facing toward or away from the two positioning parts 011 at the other end of the wafer boat 01 make rolling contact with the first positioning structure disposed at the other of the two carrying platforms 11. Moreover, the two sides of the two positioning parts 011 at one end of the wafer boat 01 in the length direction facing toward each other or away from each other make rolling contact with the second positioning structure disposed at one of the two carrying platforms 11. The two sides of the two positioning parts 011 at the other end of the wafer boat 01 in the length direction facing toward each other or away from each other make rolling contact with the second positioning structure disposed at the other of the two carrying platforms 11. As such, the first positioning structure of each of the two carrying platforms 11 performs the alignment between the wafer boat 01 and the wafer boat temporary storage device in the length direction, and the second positioning structure of each of the two carrying platforms 11 performs the alignment between the wafer boat 01 and the wafer boat temporary storage device in the width direction. Thus, the first positioning structure and the second positioning structure of each of the two carrying platforms 11 perform the alignment between the wafer boats 01 and the wafer boat temporary storage device. Then, one end of the wafer boat 01 in the length direction makes contact with one of the two carrying platforms 11, and the other end of the wafer boat 01 in the length direction makes contact with the other of the two carrying platforms 11. The two carrying platforms 11 anchor the wafer boat 01 onto the wafer boat temporary storage device.

The positioning parts 011 of the wafer boat 01 make contact with the first positioning structure and the second positioning structure on the two carrying platforms 11 of the wafer boat temporary storage device provided by the embodiments of the present disclosure. When the first positioning structure and the second positioning structure on the two carrying platforms 11 perform the alignment between the wafer boat 01 and the wafer boat temporary storage device, the positioning parts 011 of the wafer boat 01 make rolling contact with the first positioning structure and the second positioning structure on the two carrying platforms 11. Thus, compared with the sliding contact by the positioning parts 011 of the wafer boat 01 with the positioning structures of the existing wafer boat temporary storage device, the rolling contact reduces the friction force on the positioning parts 011 of the wafer boat 01, and reduces the graphite particles that are rubbed off the graphite based wafer boat 01 by the first positioning structure and the second positioning structure. When the wafer boat 01 is air cooled, the wafer carried by the wafer boat 01 may be less contaminated, thereby improving the wafer cleanliness.

In some embodiments, in the opposite direction of the two carrying platforms 11, a distance between the two first positioning structures may be smaller than a distance between the two second positioning structures. The first positioning structures make rolling contact with the two sides of the two positioning parts 011 that face toward the two positioning parts 011 at the opposite end of the wafer boat 01 in the length direction. The second positioning structures make rolling contact with the two sides of the positioning parts 011 that face toward each other at each end of the wafer boat 01 in the length direction.

When the wafer boat 01 is moved to the wafer boat temporary storage device for temporary storage, the two sides of the two positioning parts 011 at one end of the wafer boat 01 that face toward the two positioning parts 011 at the opposite end of the wafer boat 01 in the length direction make rolling contact with the first positioning structure. The two sides of the two positioning parts 011 that face toward each other at each end of the wafer boat 01 in the length direction make rolling contact with the second positioning structure. As such, the first positioning structure and the second positioning structure perform the alignment between the wafer boat 01 and the wafer boat temporary storage device. When the wafer boat 01 is carried by the carrying platforms 11, the portion between the two ends of the wafer boat 01 equipped with the positioning parts 011 in the length direction for carrying the wafer will be located between the two first positioning structures. Because the distance between the two second positioning structures is greater than the distance between the two first positioning structures, the portion between the two ends of the wafer boat 01 equipped with the positioning parts 011 in the length direction for carrying the wafer will also be located between the two second positioning structures. Thus, the first positioning structures and the second positioning structures are prevented from causing damage to the wafer carried by the wafer boat 01, thereby improving function stability of the wafer boat temporary storage device. Such design makes the carrying platforms 11 carry the wafer boat 01 close to the center of the wafer boat 01, such that the carrying platforms 11 can stably carry the wafer boat 01, and improves the function stability of the wafer boat temporary storage device.

In some embodiments, as shown in FIGS. 5 to 8, the first positioning structure may include two first rollers 33 arranged apart in a direction perpendicular to a direction in which the two carrying platforms 11 face toward each other. The two first rollers 33 are rotatably connected to the carrying platforms 11 respectively in the direction perpendicular to the direction in which the two carrying platforms 11 face toward each other, and are used to make rolling contact with the two sides (i.e., side A) of the two positioning parts 011 respectively at one end of the wafer boat 01 that face toward the two positioning parts 01 at the other end in the length direction, or make rolling contact with the two sides (i.e., side B) of the two positioning parts 011 respectively at one end of the wafer boat 01 that face away from the two positioning portions 011 at the other end in the length direction.

The rotatable connection between the first rollers 33 and the carrying platforms 11 may be implemented in various ways. For example, the first positioning structure may also include two first connection parts 31 and two first rotation shafts 32. The two first connection parts 31 are both connected with the carrying platforms 11 respectively, and are spaced apart in the direction perpendicular to the direction in which the two carrying platforms 11 face toward each other. The two first rotation shafts 32 are respectively penetrated in the two first connection parts 31. An axial direction of each first rotation shaft 32 is perpendicular to the direction in which the two carrying platforms 11 face toward each other. The two first rollers 33 are respectively sleeved on the two first rotation shafts 32 to be rotatable around an axis of each first rotation shaft 32.

Such design allows the two first rollers 33 to be connected to the carrying platforms 11 respectively through the two rotation shafts and the two connection parts, and are spaced apart in the direction perpendicular to the direction in which the two carrying platforms 11 face toward each other. When the wafer boat 01 is moved to the wafer boat temporary storage device for temporary storage, the two sides (i.e., side A) of the two positioning parts 011 at one end of the wafer boat 01 that face toward the two positioning parts 011 at the opposite end in the length direction make contact with the two first rollers 33 of the first positioning structure respectively on one of the two carrying platforms 11, and the two sides (i.e., side A) of the two positioning parts 011 at the other end of the wafer boat 01 that face toward the two positioning parts 011 at the opposite end in the length direction make contact with the two first rollers 33 of the first positioning structure respectively on the other of the two carrying platforms 11. Because the axial direction of the first rotation shaft 32 is perpendicular to the direction in which the two carrying platforms 11 face toward each other, and the first rollers 33 are sleeved on the first rotation shafts 32 respectively to rotate around the axis of the first rotation shafts 32, the first rollers 33 may rotate around the axis of the first rotation shafts 32 respectively driven by the positioning parts 011, such that the first rollers 33 make rolling contact with the two sides of the two positioning parts 011 at one end of the wafer boat 01 that face toward the two positioning parts at the other end of the wafer boat 01 in the length direction.

In some embodiments, as shown in FIGS. 5-8, the second positioning structure may include two second rollers 23 arranged apart in the direction perpendicular to the direction in which the two carrying platforms 11 face toward each other. The two second rollers 23 are rotatably connected to the carrying platforms 11 respectively in a direction parallel to the direction in which the two carrying platforms 11 fac toward each other, and are used to make rolling contact with the two sides (i.e., side C) of the two positioning parts 011 respectively that face toward each other at one end of the wafer boat 01 in the length direction, or make rolling contact with the two sides (i.e., side D) of the two positioning parts 011 respectively that face away from each other at one end of the blade boat 01 in the length direction.

The rotatable connection between the second rollers 23 and the carrying platforms 11 may be implemented in various ways. For example, the second positioning structure may also include two second connection parts 21 and two second rotation shafts 22. The two second connection parts 21 are both connected with the carrying platforms 11 respectively, and are spaced apart in the direction perpendicular to the direction in which the two carrying platforms 11 face toward each other. The two second rotation shafts 22 are respectively penetrated in the two second connection parts 21. An axial direction of each second rotation shaft 22 is parallel with the direction in which the two carrying platforms 11 face toward each other. The two second rollers 23 are respectively sleeved on the two second rotation shafts 22 to be rotatable around an axis of each second rotation shaft 22. The two second rollers 23 make rolling contact with the two sides (i.e., side C in FIG. 2) of the two positioning parts 011 respectively that face toward each other at one end of the wafer boat 01 in the length direction.

Such design allows the two second rollers 23 to be connected to the carrying platforms 11 respectively through the two second rotation shafts 22 and the two connection parts 21, and are spaced apart in the direction perpendicular to the direction in which the two carrying platforms 11 face toward each other. When the wafer boat 01 is moved to the wafer boat temporary storage device for temporary storage, the two sides (i.e., side C) of the two positioning parts 011 that face toward each other at one end of the wafer boat 01 in the length direction make respective contact with the two second rollers 23 of the second positioning structure on one of the two carrying platforms 11, and the two sides (i.e., side C) of the two positioning parts 011 that face toward each other at the other end of the wafer boat 01 in the length direction make respective contact with the two second rollers 23 of the second positioning structure on the other of the two carrying platforms 11. Because the axial direction of the second rotation shaft 22 is parallel to the direction in which the two carrying platforms 11 face toward each other, and the second roller 23 are sleeved on the second rotation shafts 22 respectively to rotate around the axis of the second rotation shafts 22, the second rollers 23 may rotate around the axis of the second rotation shafts 22 respectively driven by the positioning parts 011, such that the second rollers 23 make rolling contact with the two sides of the two positioning parts 011 at one end of the wafer boat 01 that face toward each other.

In some embodiments, one second connection part 21 may be adjusted close to or away from a connection of the other second connection part 21 with the corresponding carrying platform 11 in the direction perpendicular to the direction in which the two carrying platforms 11 face toward each other.

The above design considers different distances between the two positioning parts 011 arranged apart in the width direction of the wafer boat 01 for different wafer boats 01. By adjusting the second connection part 21, the second connection part 21 may be made close to or away from the other second connection part 21 (as shown by arrows at the second connection part 21 in FIG. 8) in the direction perpendicular to the direction in which the two carrying platforms 11 face toward each other. The distance between the two second connection parts 21 may be adjusted in the direction perpendicular to the direction in which the two carrying platforms face toward each other, such that the two second rollers 23 that are connected to the two second connection parts 21 respectively are adapted to the two positioning parts 011 that are separated by different distances in the width direction of the wafer boat 01. Thus, the wafer boat temporary storage device can be adapted to different wafer boats 01, thereby improving adaptability of the wafer boat temporary storage device.

For example, by adjusting one of the two second connection parts 21 closer to the other second connection part 21 in the direction perpendicular to the direction in which the two carrying platforms 11 face toward each other, the distance between the two second connection parts 21 may be reduced in the direction perpendicular to the direction in which the two carrying platforms 11 face toward each other. The two second rollers 23 respectively connected to the two second connection parts 21 are made to adapt to the two positioning parts 011 that are separated by a smaller distance in the width direction of the wafer boat 01. By adjusting one of the two second connection parts 21 away from the other second connection part 21 in the direction perpendicular to the direction in which the two carrying platforms 11 face toward each other, the distance between the two second connection parts 21 may be increased in the direction perpendicular to the direction in which the two carrying platforms 11 face toward each other. The two second rollers 23 respectively connected to the two second connection parts 21 are made to adapt to the two positioning parts 011 that are separated by a greater distance in the width direction of the wafer boat 01.

Figure 6:
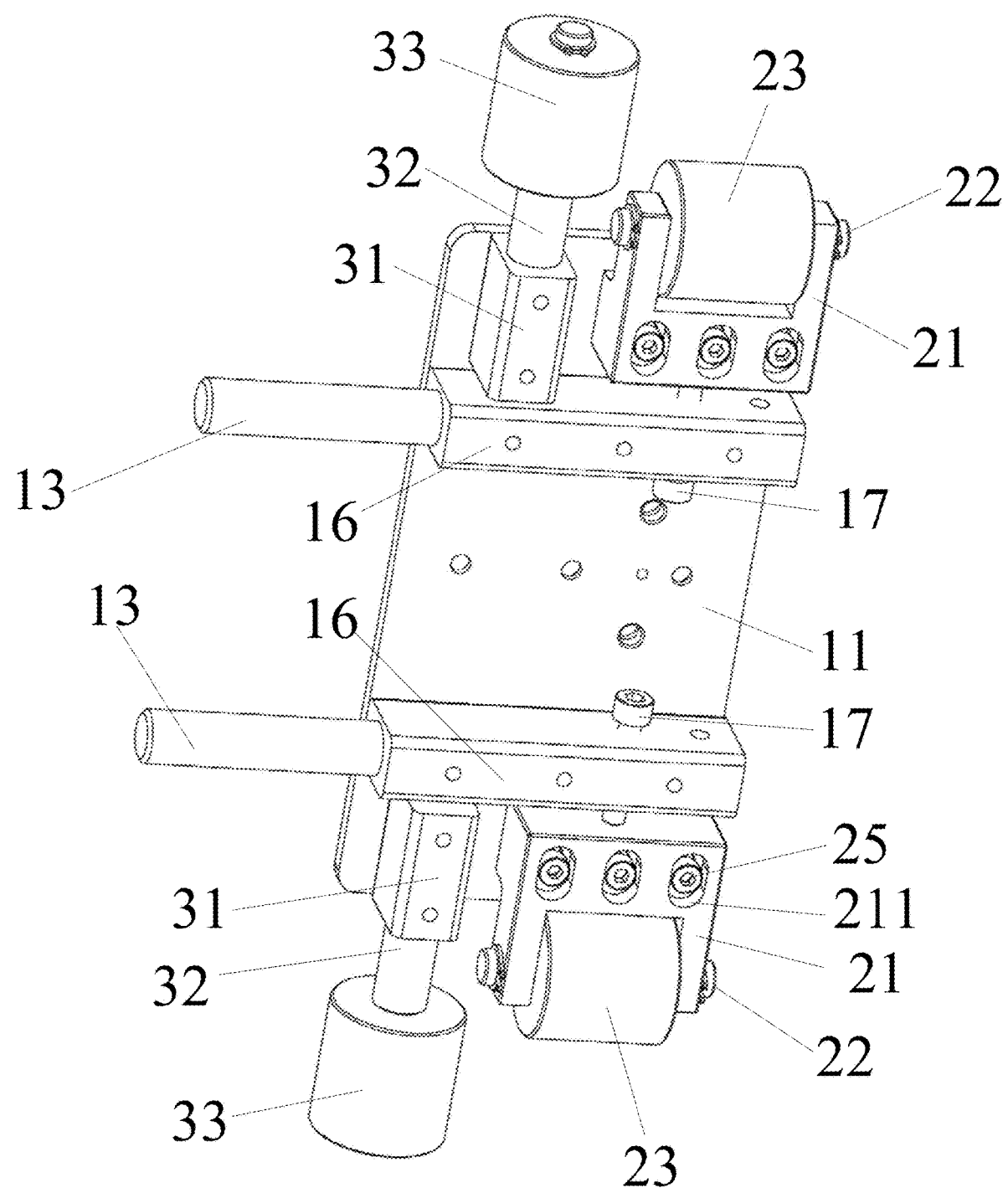
FIG. 6 is a schematic structural bottom view of a load platform, a first positioning structure, a second positioning structure of a wafer boat temporary storage apparatus in a semiconductor processing device according to some embodiments of the present disclosure.
Figure 8:
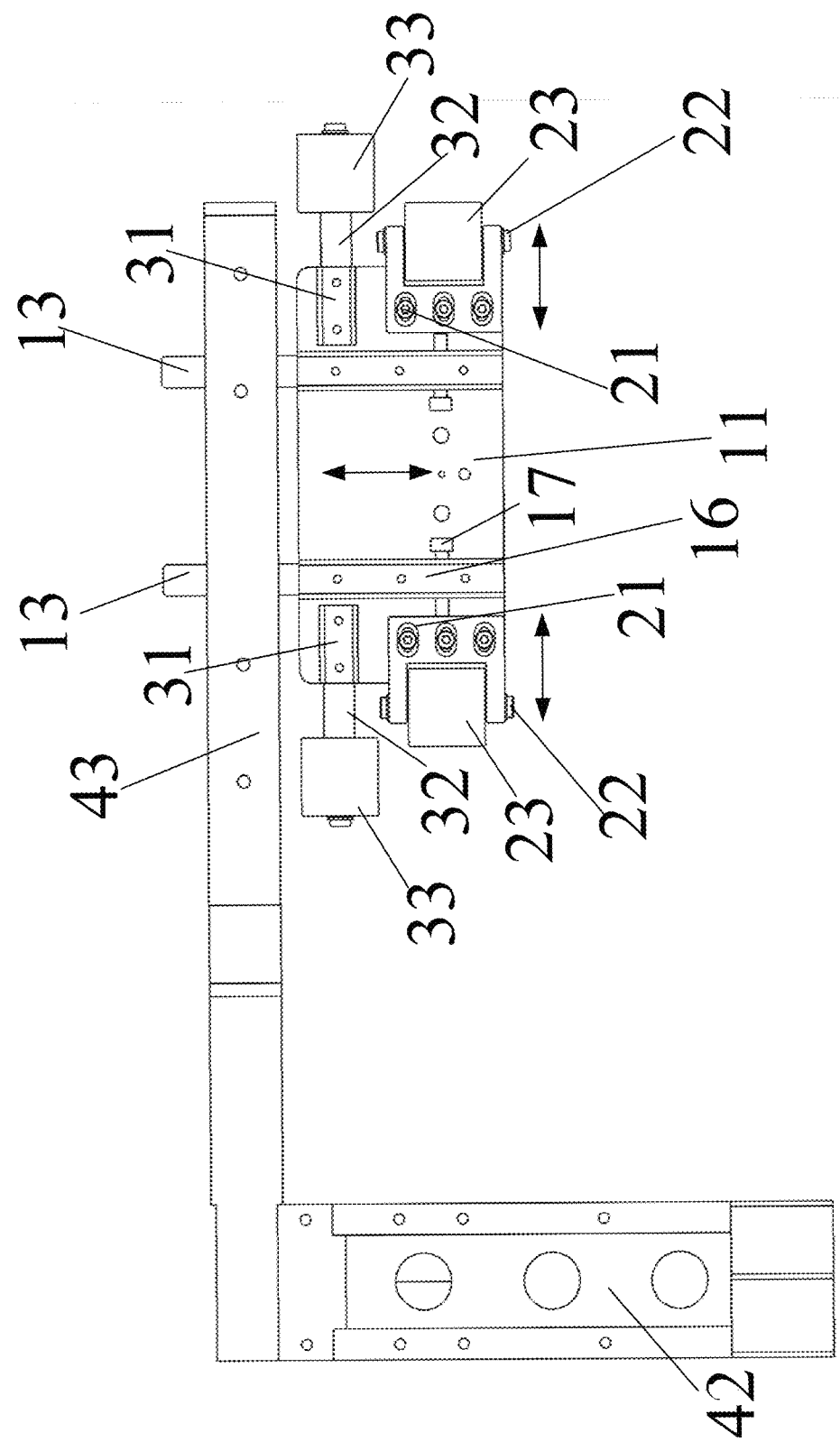
FIG. 8 is a schematic structural bottom view of a wafer boat temporary storage apparatus including a load platform, a first positioning structure, and a second positioning structure in a semiconductor processing device according to some embodiments of the present disclosure.

In some embodiments, as shown in FIGS. 6 and 8, each carrying platform 11 may include a first threaded connection hole, and each second connection part 21 may include a long connection hole 211. A long axis of the long connection hole 211 is perpendicular to the direction in which the two carrying platforms 11 face toward each other. The second positioning structure may further include a first threaded connection part 25. The first threaded connection part 25 passes through the connection long hole 211 and is threadedly connected to the first threaded connection hole. The first threaded connection part 25 may adjust its relative position with the corresponding carrying platform 11 in the direction perpendicular to the direction in which the two carrying platforms 11 face toward each other by adjusting its relative position with the long connection hole 211 in the long axis direction.

When it is necessary to adjust the distance between the two second connection parts 21 in the direction perpendicular to the direction in which the two carrying platforms 11 face toward each other, the first threaded connection part 25 may be loosened to allow the second connection part 21 to move relative to the carrying platform 11. Because the long axis of the long connection hole 211 provided on the second connection part 21 is perpendicular to the direction in which the two bearing platforms 11 face toward each other, the second connection part 21 can move in the direction perpendicular to the direction in which the two carrying platforms 11 face toward each other. The two connection parts 21 are made close to or away from the each other in the direction perpendicular to the direction in which the two carrying platforms 11 face toward each other. When the distance between the two second connection parts 21 is adjusted to a suitable position in the direction perpendicular to the direction in which the two carrying platforms 11 face toward each other, the first threaded connection part 25 may be tightened to fix the second connection part 21 with the carrying platform 11, and the second connection part 21 is unable to move relative to the carrying platform 11. Thus, the adjustment of the distance between the two second connection parts 21 in the direction perpendicular to the direction in which the two carrying platforms 11 face toward each other is completed.

Figure 5:
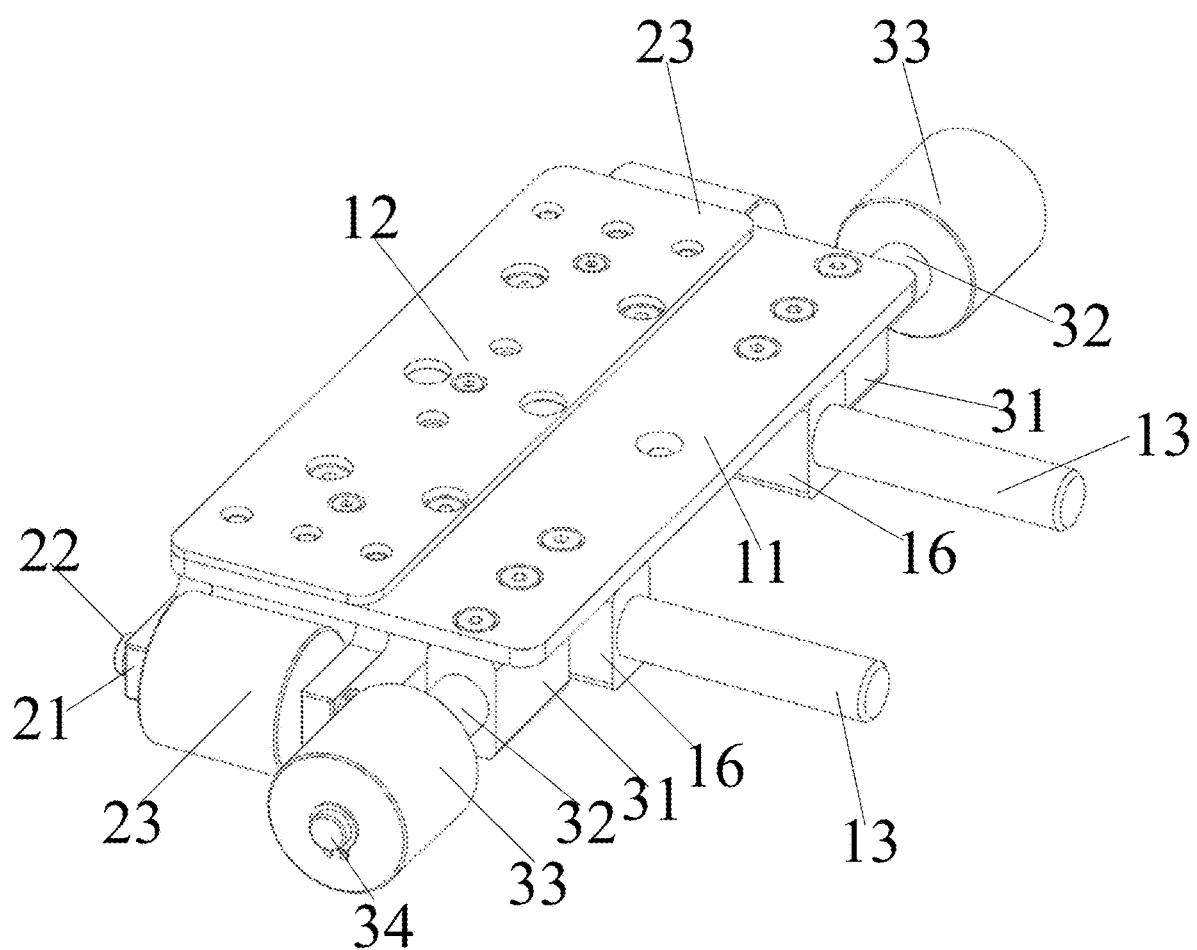
FIG. 5 is a schematic structural diagram of a load platform, a first positioning structure, a second positioning structure of a wafer boat temporary storage apparatus in a semiconductor processing device according to some embodiments of the present disclosure.

In some embodiments, as shown in FIG. 5, the first positioning structure may further include a locking ring 34. One end of the first rotation shaft 32 includes an annular groove for the locking ring 34 to be inserted. The locking ring 34 may be inserted into the annular groove to press against one end of the first roller 33 sleeved on the first rotation shaft 32 to lock the first roller 33 on the first rotation shaft 32.

In some embodiments, as shown in FIGS. 4, 7-9, 11, and 16, the wafer boat temporary storage device may further include two first support columns 41, two first support plates 42, and two second support plates 43. Axes of the two first support columns 41 are parallel with each other. The two first support plates 42 are respectively connected to the two first support columns 41, and axes of the two first support plates 42 that are perpendicular to surfaces of the two first support plates 42 are perpendicular to the axes of the two first support columns 41 respectively. The two second support plates 43 are respectively connected to the two first support plates 42, and the axes of the two second support plates 43 that are perpendicular to surfaces of the two second support plates 43 are perpendicular to the axes of the two first support plates 42 that are perpendicular to the surfaces of the two first support plates 42 respectively and are perpendicular to the axes of the two first support columns 41. The two carrying platforms 11 are respectively connected to the two second support plates 43. The surfaces refer to surfaces having a largest area among outer surfaces of the first support plates 42 and the second support plates 43.

When the two first support columns 41 are placed vertically, the axes of the two first support columns 41 are parallel to the vertical direction. Because the axes of the two first support plates 42 that are perpendicular to the surfaces of the two first support plates 42 are perpendicular to the axes of the two first support columns 41, the axes of the two first support plates 42 that are perpendicular to the surfaces of the two first support plates 42 are parallel to the horizontal direction. Because the axes of the two second support plates 43 that are perpendicular to the surfaces of the two second support plates 43 are perpendicular to the axes of the two first support plates 42 that are perpendicular to the surfaces of the two first support plates 42, and are also perpendicular to the axes of the two first support columns 41, the axes of the two second support plates 43 that are perpendicular to the surfaces of the two second support plates 43 are parallel to the horizontal direction, and the axes of the two first support plates 42 that are perpendicular to the surfaces of the two first support plates 42 are perpendicular to the horizontal direction. That is, the axes of the two second support plates 43 that are perpendicular to the surfaces of the two second support plates 43 and the axes of the two first support plates 42 that are perpendicular to the surfaces of the first support plates 42 form an "L" shape. The two carrying platforms 11 are respectively connected to the two second support plates 43 and are arranged oppositely. The two first support columns 41 respectively support the two first support plates 42 and the two second support plates 43 to support the two carrying platforms 11 such that the two carrying platforms 11 can carry the wafer boat 01.

In some embodiments, as shown in FIGS. 4, 7, 9, 11 and 16, the wafer boat temporary storage device may further include two first connection parts 45. The two first connection parts 45 are respectively connected to the two first support columns 41, and are respectively connected to the two first support plates 42. That is, the two first support plates 42 are respectively connected to the two first support columns 41 through the two first connection parts 45.

Figure 11:
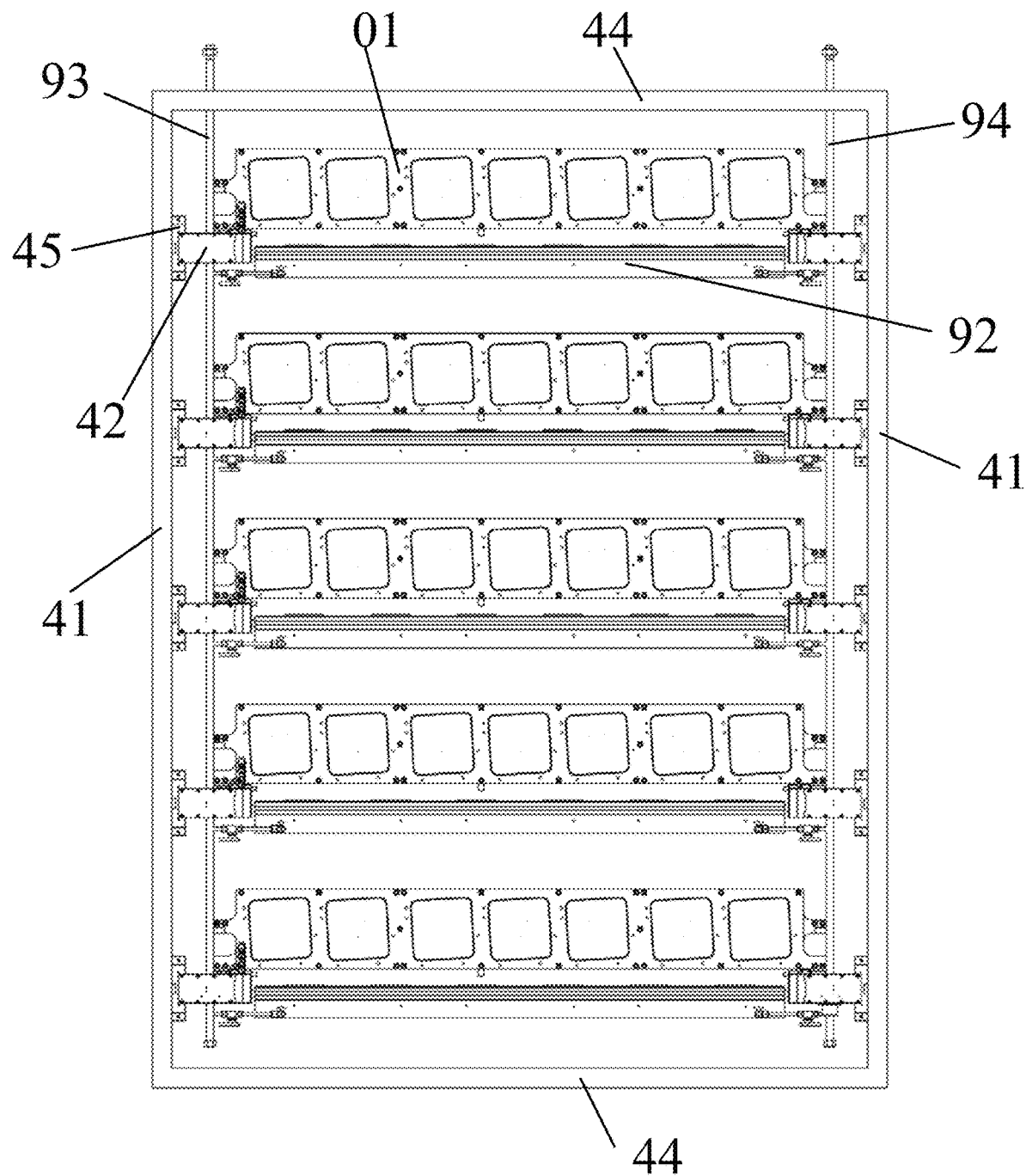
FIG. 11 is a schematic structural diagram of a wafer boat temporary storage apparatus storing a plurality of wafer boats in a semiconductor processing device according to some embodiments of the present disclosure.

In some embodiments, as shown in FIG. 11, multiple first support plates 42 and multiple second support plates 43 may be disposed at each first support column 41 in the axial direction thereof. The wafer boat temporary storage device may include multiple carrying groups. Each carrying group may include two carrying platforms 11 arranged oppositely. The number of carrying groups is the same as the number of second support plates 43 disposed at each first support column 41 in the axial direction thereof. The carrying platforms 11 of each carrying group are respectively connected to multiple second support plates 43. Each carrying group is used to carry a wafer boat 01. Multiple wafer boats 01 can be carried at the same time by multiple carrying groups of carrying platforms 11, thereby increasing temporary storage capacity of the wafer boat temporary storage device.

In some embodiments, as shown in FIG. 11, the wafer boat temporary storage device may further include two second support columns 44. Both ends of one second support column 44 are respectively connected to one end of each of the two first support columns 41. Both ends of another second support column 44 are respectively connected to the other end of each of the two first support columns 41, such that the two first support columns 41 and the two second support columns 44 can form a frame, thereby improving stability of the wafer boat temporary storage device.

In some embodiments, one carrying platform 11 may be adjustably connected to the second support plate 43 to move close to or away from the other corresponding carrying platform 11 in the direction in which the two carrying platforms face toward each other.

In the above design, for different wafer boats 01, a distance between the two positioning parts 011 at one end may be different from a distance between the two positioning parts 011 at the other end in the length direction of the wafer boat 01. By adjusting the carrying platforms 11, one carrying platform 11 moves closer to or away from the other carrying platform 11 in the direction in which the two carrying platforms 11 face toward each other (as shown by the arrow on the carrying platforms 11 in FIG. 8). The distance between the two carrying platforms 11 may be adjusted in the direction in which the two carrying platforms 11 face toward each other to make the two first rollers 33 connected to one carrying platform 11 and the two first rollers 33 connected to the other carrying platform 11 adapt to the two positioning parts 011 that are separated by different distances in the length direction of the wafer boat 01, thereby improving the adaptability of the wafer boat temporary storage device.

For example, by adjusting one carrying platform 11 to move closer to the other carrying platform 11 in the direction in which the two carrying platforms 11 face toward each other, the distance between the two carrying platforms 11 in the direction in which the two carrying platforms 11 face toward each other can be reduced to make the two first rollers 33 connected to one carrying platform 11 and the two first rollers 33 connected to the other carrying platform 11 adapt to the two positioning parts 011 that are separated by a smaller distance in the length direction of the wafer boat 01. By adjusting one carrying platform 11 to move away from the other carrying platform 11 in the direction in which the two carrying platforms 11 face toward each other, the distance between the two carrying platforms 11 in the direction in which the two carrying platforms 11 face toward each other can be increased to make the two first rollers 33 connected to one carrying platform 11 and the two first rollers 33 connected to the other carrying platform 11 adapt to the two positioning parts 011 that are separated by a greater distance in the length direction of the wafer boat 01.

In some embodiments, as shown in FIGS. 5-8, the wafer boat temporary storage device may also include an adjustment shaft 13, a first fixing part 14, and a second fixing part 15. The first fixing part 14 is connected to the second support plate 43, and is detachably connected to the second fixing part 15. The first fixing part 14 and the second fixing part 15 include a first groove and a second groove respectively. The first groove and the second groove are coordinated to form an adjustment hole. An axial direction of the adjustment hole is parallel to the direction in which the two carrying platforms 11 face toward each other. The adjustment shaft 13 is connected to a corresponding carrying platform 11, and penetrates the adjustment hole. The adjustment shaft 13 may adjust the distance between the two carrying platforms 11 by adjusting its relative position with the adjustment hole in the direction parallel to the direction in which the two carrying platforms 11 face toward each other.

When the distance between the two carrying platforms 11 in the direction in which the two carrying platforms 11 face toward each other needs to be adjusted, the second fixing part 15 and the first fixing part 14 may be disassembled to separate the second groove from the first groove. That is, the adjustment hole no longer clamps the adjustment shaft 13, such that the adjustment shaft 13 connected to the carrying platform 11 can move relative to the adjustment hole. Because the axial direction of the adjustment shaft 13 is parallel to the direction in which the two carrying platforms 11 face toward each other, the adjustment shaft 13 may be moved in the direction in which the two carrying platforms 11 face toward each other, such that one carrying platform 11 connected to the adjustment shaft 13 moves closer to or away from the other carrying platform 11 in the direction in which the two carrying platforms 11 face toward each other. When the distance between the two carrying platforms 11 in the direction in which the two carrying platforms 11 face toward each other is adjusted to a suitable position, the second fixing part 15 may be connected to the first fixing part 14 such that the first groove and the second groove together form the adjustment hole. The adjustment hole clamps the adjustment shaft 13, such that the adjustment shaft 13 connected to the carrying platform 11 cannot move relative to the adjustment hole. Thus, the adjustment of the distance between the two carrying platforms 11 in the direction in which the two carrying platforms 11 face toward each other is completed.

In some embodiments, as shown in FIGS. 6 and 8, the wafer boat temporary storage device may further include a third connection part 16 and a locking part 17. The third connection part 16 is connected to the carrying platform 11. The adjustment shaft 13 penetrates into the third connection part 16, and connects to the third connection part 16. The locking part 17 penetrates the third connection part 16 and presses against the second connection part 21 to lock the position of the third connection part 16.

Figure 7:
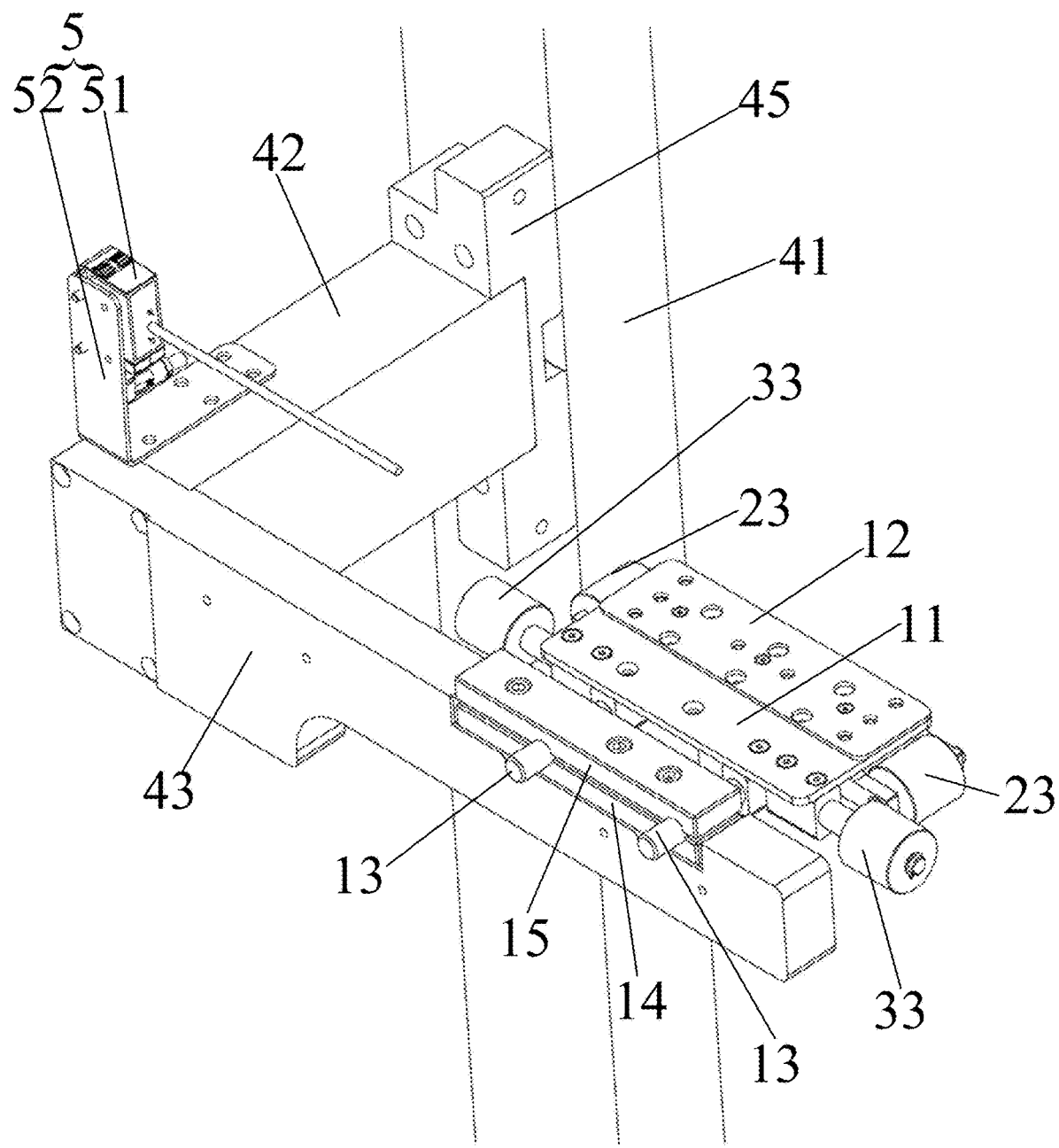
FIG. 7 is a schematic structural diagram of a wafer boat temporary storage apparatus including a load platform, a first positioning structure, and a second positioning structure in a semiconductor processing device according to some embodiments of the present disclosure.

In some embodiments, as shown in FIGS. 5 and 7, the carrying platform 11 may further include a height difference compensator 12. The height difference compensator 12 may be disposed on the carrying platform 11. The height difference compensator 12 may be disposed at one of the carrying platforms 11, and an upper surface of the height difference compensator 12 is higher than an upper surface of the carrying platform 11.

Figure 10:
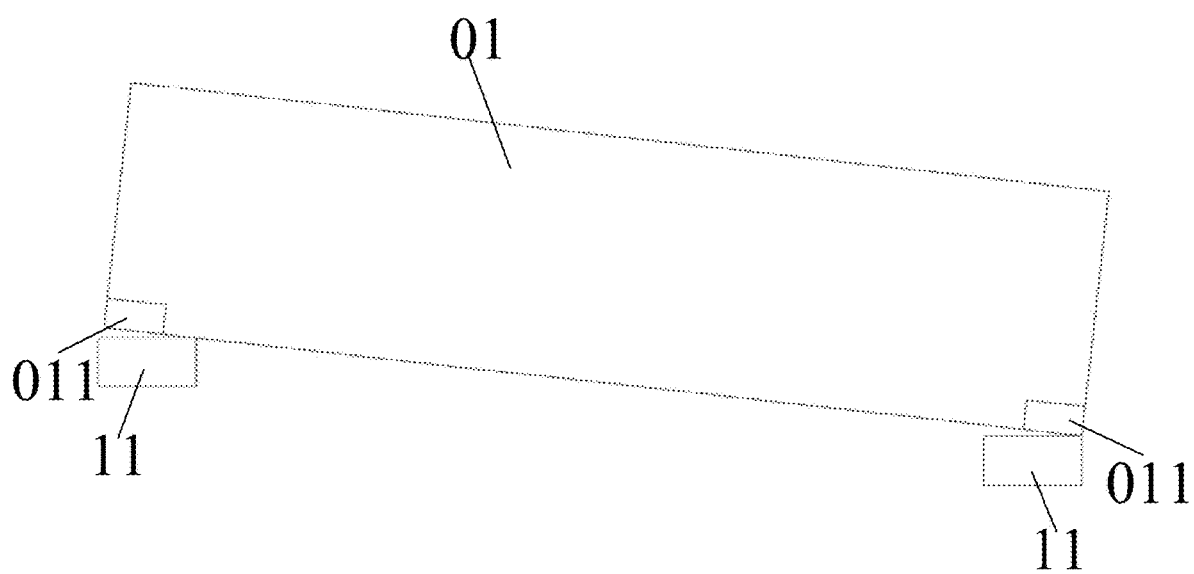
FIG. 10 is a schematic structural diagram of a wafer boat being loaded on a tilted wafer boat temporary storage apparatus in a semiconductor processing device according to some embodiments of the present disclosure.

In the above design, manufacturing tolerance and installation deviation may make it impossible for the two opposite carrying platforms 11 to be at a same level. As a result, the two opposite carrying platforms 11 respectively support the two ends of the wafer boat 01 in the length direction. When the wafer boat 01 is carried, the wafer boat 01 may be tilted (as shown in FIG. 10). As such, the part for carrying the wafer boat between the two ends of the wafer boat 01 where the positioning parts 011 are provided in the length direction may contact with the carrying platform 11. That is, the carrying platform 11 contacts with the part for carrying the wafer boat 01 between both ends of the wafer boat 01 that are provided with the positioning part 011 in the length direction. This may cause the wafer carried by the wafer boat 01 to contact with the carrying platform 11, and an external force of the carrying platform 11 may damage the wafer carried by the wafer boat 01.

In the wafer boat temporary storage device for the semiconductor processing device provided by the embodiments of the present disclosure, the height difference compensator 12 may be disposed at one of the carrying platforms 11. The height difference compensator 12 may be used to compensate a difference in the horizontal height of the two opposite carrying platforms 11, such that the wafer boat 01 can be placed horizontally on the two carrying platforms 11. In some embodiments, by arranging the height difference compensator 12 on one of the carrying platforms 11 and on a side facing away from the other carrying platform 11 in the direction in which the two carrying platforms 11 face toward each other, the height difference compensator 12 may be moved away from the part for carrying the wafer between the two ends of the wafer boat 01 provided with the positioning parts in the length direction to avoid contact with the part for carrying the wafer between the two ends of the wafer boat 01 01 provided with the positioning parts in the length direction. Thus, the height difference compensator 12 is prevented from contacting with the wafer carried by the wafer boat 01 to cause damage to the wafer carried by the wafer boat 01, thereby improving the stability of the wafer boat temporary storage device.

In some embodiments, as shown in FIGS. 5 and 7, the height difference compensator 12 may include a height difference compensation plate. An upper surface of the height difference compensation plate is used to contact with one end of the wafer boat 01.

In some embodiments, as shown in FIG. 7, the wafer boat temporary storage device may further include a detection part 5. The detection part 5 is disposed at the first support plate 42 and is used to detect whether any wafer boat is carried on the carrying platforms 11. A preset heat insulation distance may be provided between the detection part 5 and the wafer boat 01 carried on the carrying platforms 11.

By using the detection part 5 to detect whether the wafer boat 01 is carried on the carrying platforms 11, it can be avoided that when the wafer boat 01 is carried on the carrying platforms 11, the wafer boat 01 is still transferred to the carrying platforms 11, which may cause the two wafer boats 01 to collide and may cause damage to the wafer boats 01 and the wafers carried by the wafer boats 01. Thus, the stability of the wafer boat temporary storage device can be improved. By providing the preset heat insulation distance between the detection part 5 and the wafer boat 01 carried on the carrying platforms 11, high-temperature heat of the wafer boat 01 after the semiconductor process is completed can be prevented from causing damage to the detection part 5, thereby improving the stability of the wafer boat temporary storage device.

In some embodiments, the preset heat insulation distance may be greater than or equal to 80 millimeters.

Figure 9:
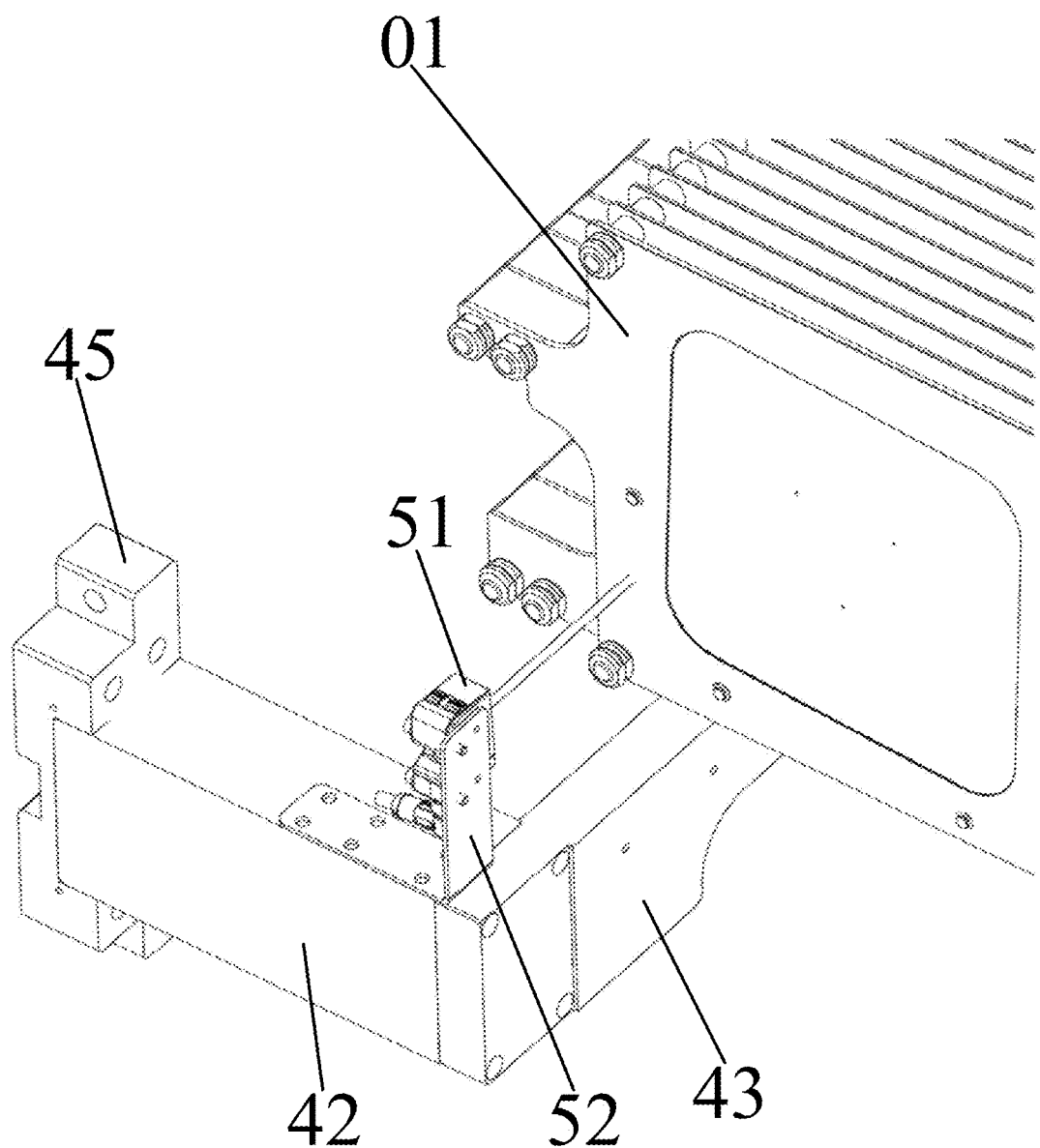
FIG. 9 is a schematic structural diagram of a wafer boat temporary storage apparatus including a detection component in a semiconductor processing device according to some embodiments of the present disclosure.

In some embodiments, as shown in FIGS. 7 and 9, the detection part 5 may include a photoelectric sensor 51. In the above design, because the photoelectric sensor 51 detects whether any wafer boat 01 is carried on the carrying platforms 11 without contacting the wafer boat 01, damage to the detection component 5 caused by the high-temperature heat of the wafer boat 01 after the semiconductor process is completed can be avoided, thereby improving the stability of the wafer boat temporary storage device.

In some embodiments, as shown in FIGS. 7 and 9, the photoelectric sensor 51 may be located at a connection between the first support plate 42 and the second support plate 43.

In some embodiments, as shown in FIGS. 7 and 9, the detection part 5 may also include a detection support part 52. The detection support part 52 may be provided on the first support plate 42. The photoelectric sensor 51 may be connected to the detection support part 52. The detection support part 52 52 may be used to support the photoelectric sensor 51.

In some embodiments, as shown in FIGS. 11-17, the wafer boat temporary storage device may further include a liquid cooling part 9, an air cooling part, and a filter part 7. The liquid cooling part 9 is used to cool ambient air. The air cooling part is arranged closer to the carrying platforms 11 than the liquid cooling part 9, and is used to blow the ambient air cooled by the liquid cooling part 9 to the wafer boat 01 carried on the carrying platforms 11. The filter part 7 is disposed between the liquid cooling part 9 and the air cooling part to filter the ambient air blown by the air cooling part to the wafer boat 01 carried on the carrying platforms 11.

By cooling the wafer boat 01 carried on the carrying platforms 11 by the liquid cooling part 9 and the air cooling part, a temperature of the high-temperature wafer boat 01 may be decreased after the semiconductor processing is completed. That is, after the semiconductor processing is completed, the wafer boat 01 is moved to the carrying platforms 11. The liquid cooling part 9 and the air cooling part together cool the wafer boat 01 carried on the carrying platforms 11, such that the temperature of the wafer boat 01 is decreased.

The liquid cooling part 9 may exchange heat with the ambient air and may cool the ambient air. The air cooling part is arranged closer to the carrying platforms 11 relative to the liquid cooling part 9. The air cooling part may blow the ambient air cooled by the liquid cooling part 9 to the wafer boat 01 carried on the carrying platforms 11 to cause the ambient air cooled by the liquid cooling part 9 to exchange heat with the wafer boat 01 to cool the wafer boat 01. The filter part 7 is arranged between the liquid cooling part 9 and the air cooling part. As such, when the ambient air around the liquid cooling part 9 that has been cooled by the liquid cooling part 9 is blown toward the wafer boat 01 by the air cooling part, the ambient air may pass through the filter part 7 and may be filtered by the filter part 7.

As such, even if the wafer boat 01 rubs against the first positioning structure and the second positioning structure to generate particles, the filter part 7 may filter out the particles blown up by the air cooling part before reaching the wafer boat 01 with the ambient air, thereby preventing the particles from reaching the wafer boat 01. Moreover, there may be particles around the wafer boat temporary storage device in addition to the particles generated by the friction between the wafer boat 01 and the first positioning structure and the second positioning structure. These miscellaneous particles other than the particles caused by the friction between the wafer boat 01 and the first positioning structure and the second positioning structure may also be blown up by the air cooled part and may be filtered by the filter part 7 before reaching the wafer boat 01 to prevent the miscellaneous particles from reaching the wafer boat 01. Thus, the contamination to the wafer carried by the wafer boat 01 can be further reduced, thereby improving the cleanliness of the wafer.

In some embodiments, as shown in FIG. 11, the liquid cooling part 9, the air cooling part, and the filter part 7 may be arranged under the corresponding carrying platforms 11.

In some embodiments, as shown in FIGS. 4 and 11, the liquid cooling part 9, the air cooling part, and the filter part 7 may be connected to the second support plate 43.

In some embodiments, as shown in FIG. 11, when multiple first support plates 42 and multiple second support plates 43 are provided on the first support columns 41 in the axial direction thereof, the wafer boat temporary storage device may include multiple carrying groups. Each carrying group includes two carrying platforms 11 arranged oppositely. The number of carrying groups is the same as the number of second support plates 43 disposed on the first support columns 41 in the axial direction thereof. When the carrying platforms 11 of each carrying group are connected to multiple second support plates 43 in one-to-one correspondence, the number of liquid cooling parts 9, the air cooling parts, and filter parts 7 may also be multiple. Multiple liquid cooling parts 9, multiple air cooling parts, and multiple filter parts 7 may be connected to multiple second support plates 43 in one-to-one correspondence for cooling the wafer boat 01 carried on the carrying platforms 11 in one-to-one correspondence.

In some embodiments, a total height of the liquid cooling part 9, the air cooling part, and the filter part 7 may be less than or equal to 90 mm. As such, a space occupied by the liquid cooling part 9, the air cooling part, and the filter part 7 in the height direction can be reduced, thereby providing a large space for the carrying platforms 11 to carry the wafer boat 01.

In some embodiments, the filter part 7 may include cotton. The porosity of the cotton is small, which can not only block particles, but also allow the ambient air blown by the air cooling part toward the wafer boat 01 to pass through. Moreover, the cotton may also attract particles. Compared with other filters, the cotton filter provides more desired filtering effect. Thus, the contamination on the wafer carried by the wafer boat 01 can be further reduced, thereby improving the cleanliness of the wafer.

Figure 12:
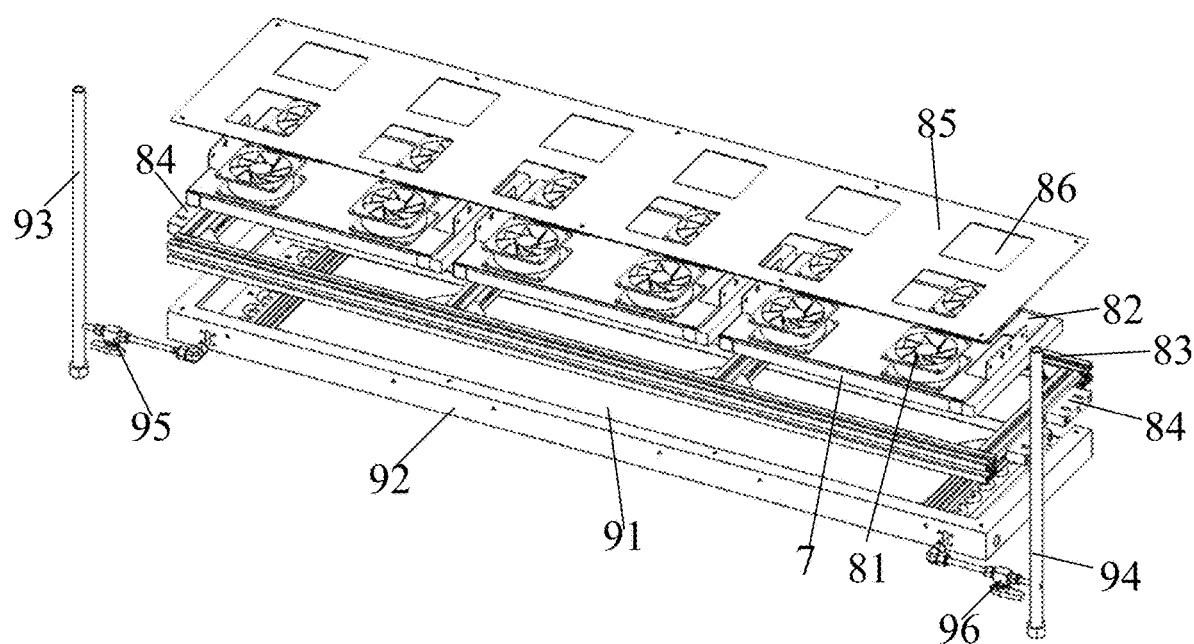
FIG. 12 is a schematic structural diagram showing a liquid cooling component, an air cooling component, and a filtering component of a wafer boat temporary storage apparatus in a semiconductor processing device according to some embodiments of the present disclosure.
Figure 13:
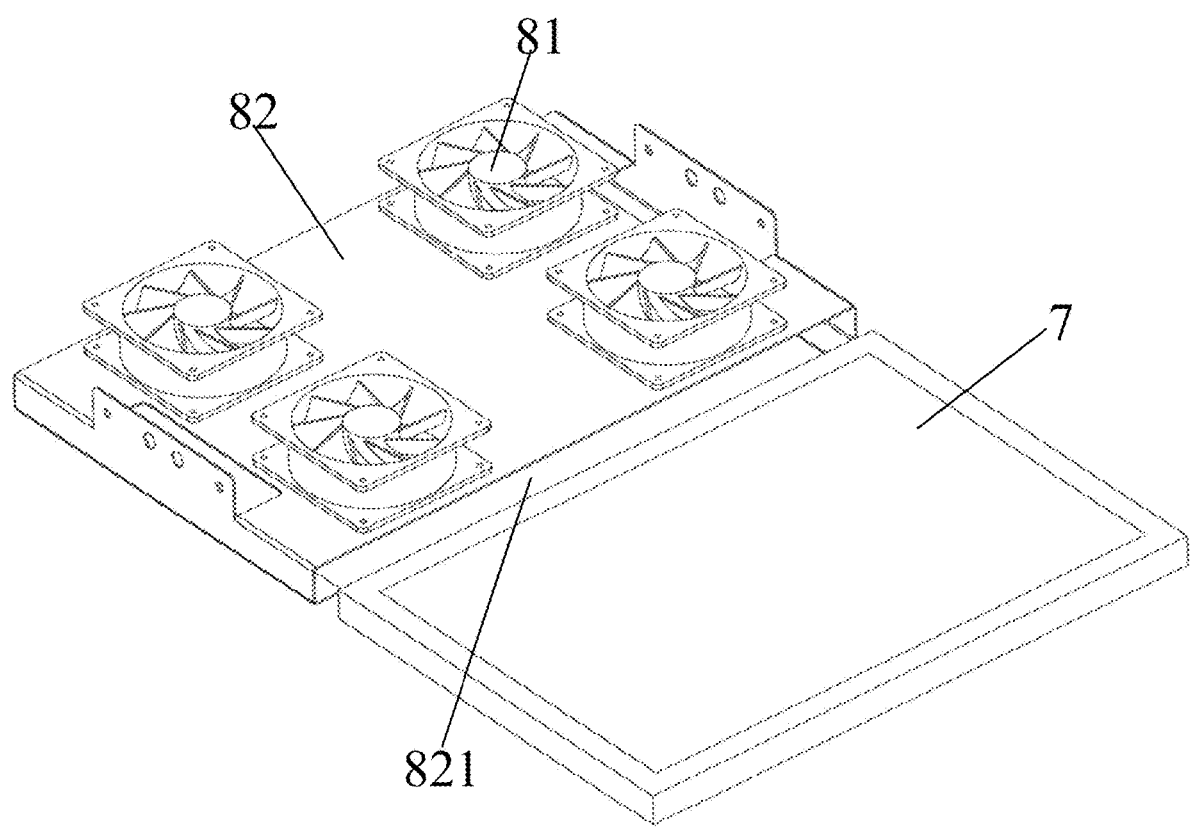
FIG. 13 is a schematic structural diagram showing fans, a fan bracket, and a filtering component of a wafer boat temporary storage apparatus in a semiconductor processing device according to some embodiments of the present disclosure.
Figure 14:
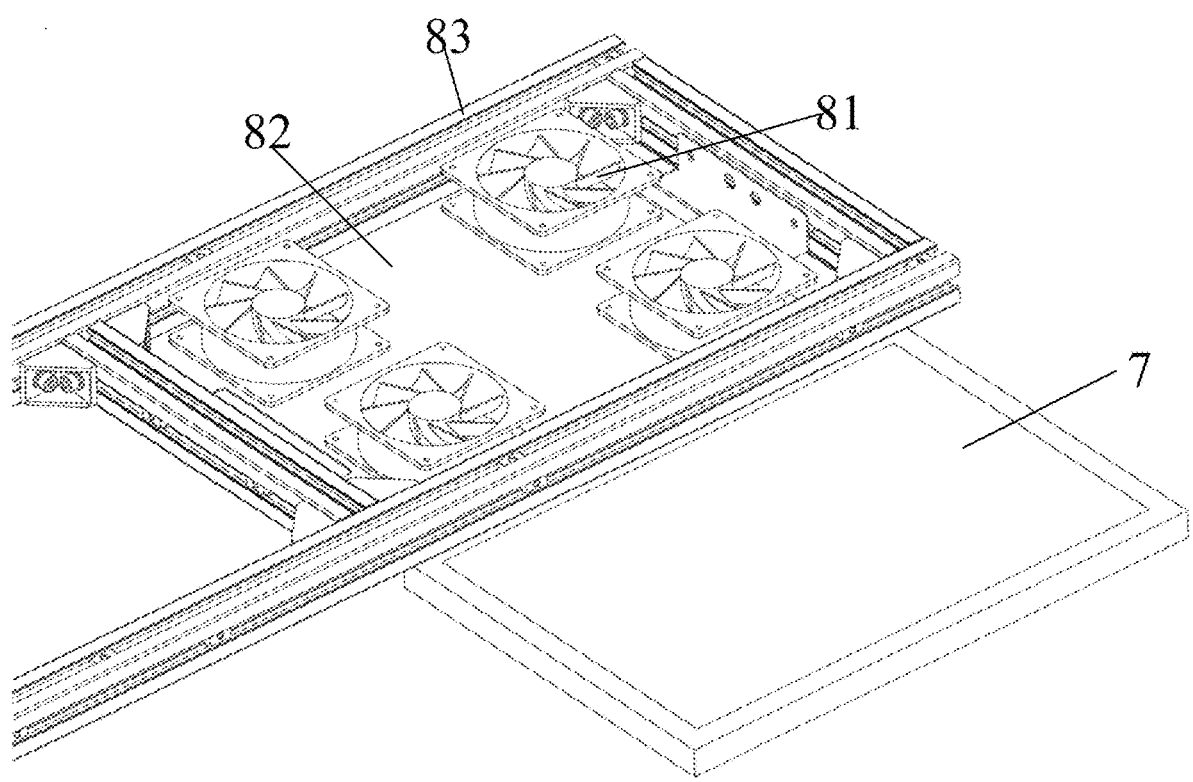
FIG. 14 is a schematic structural diagram showing a fan, a fan bracket, a support frame, and a filtering component of a wafer boat temporary storage apparatus in a semiconductor processing device according to some embodiments of the present disclosure.

In some embodiments, as shown in FIGS. 12 and 13, the air cooling part may include a fan 81 and a first support frame 82. The fan 81 is disposed above the first support frame 82 for blowing the ambient air cooled by the liquid cooling part 9 toward the wafer boat 01 carried on the carrying platforms 11. The first support frame 82 includes an accommodation slot 821 under the first support frame 82 for accommodating the filter part 7. The first support frame 82 includes ventilation vents connected to the fan 81 and the accommodation slot 821 respectively. The accommodation slot 821 includes a first retrieval opening for retrieving the filter part 7.

That is, the filter part 7 is accommodated in the accommodation slot 821. The fan 81 is disposed above the first support frame 82. When the air cooling part blows the ambient air cooled by the liquid cooling part 9 toward the wafer boat 01, the fan 81 provides power to blow the ambient air cooled by the liquid cooling part 9 from the bottom of the filter part 7 to the top of the filter part 7. In the process of moving from the bottom of the filter part 7 to the top of the filter part 7, the ambient air may sequentially pass through the accommodation slot 821, the filter part 7, and the ventilation vents. The ambient air may be filtered by the filter part 7 when passing through the filter part 7, such that the particles flowing with the ambient air can be filtered out by the filter part 7. The accommodation slot 821 includes the first retrieval opening for retrieving the filter part 7. A used filter part may be taken out from the accommodation slot 821 through the first retrieval opening, and a new filter part 7 may be placed into the accommodation slot 821, thereby facilitating replacement of the filter part 7.

In some embodiments, as shown in FIGS. 12-15, the number of fans 81 may be multiple, and multiple fans 81 may be divided into multiple fan groups. Each fan group includes at least one fan 81. The number of the first support frame 82 may also be multiple. The air cooling part may also include a second support frame 83. Multiple fan groups may be arranged on multiple first support frames 82 in one-to-one correspondence. The second support frame 83 may include multiple installation spaces for installing multiple first support frames 82 inside in one-to-one correspondence. The second support frame 83 may include multiple second retrieval openings that are connected to multiple installation spaces and multiple first retrieval openings in one-to-one correspondence. Each second retrieval opening is used for retrieving the filter part 7.

By arranging multiple air cooling parts, the amount of ambient air blown toward the wafer boat 01 may be increased, thereby improving cooling effect of the wafer boat 01, reducing cooling time of the wafer boat 01, and improving operation efficiency.

For example, as shown in FIGS. 12-15, the number of fans 81 may be twelve. The 12 fans 81 are divided into three fan groups. Each fan group includes four fans 81. The four fans 81 of each fan group are arranged on one first support frame 82. The second support frame 83 includes three first support frames 82 for three installation spaces in one-to-one correspondence. The second support frame 83 includes three second retrieval openings connected to the three first retrieval openings of the three installation spaces and three first support frames 82 in one-to-one correspondence. Through each second retrieval opening, the used filter part 7 may be taken out of the accommodation slot 821 and the new filter part 7 may be placed into the accommodation slot 821, thereby facilitating the replacement of the filter part 7.

However, the number of fans 81, the number of fan groups, the number of fans 81 of each fan group, the number of first support frames 82, the number of installation spaces of the second support frame 83, and the number of second retrieval openings are not limited thereto.

In some embodiments, as shown in FIGS. 4 and 12, the air cooling part may also include a fan protection part 85. The fan protection part 85 covers the top of the fan 81. The fan protection part 85 includes exposure openings 86 for exposing the fans 81.

The ambient air blown by the fans 81 toward the wafer boat 01 passes through the exposure openings 86.

Figure 15:
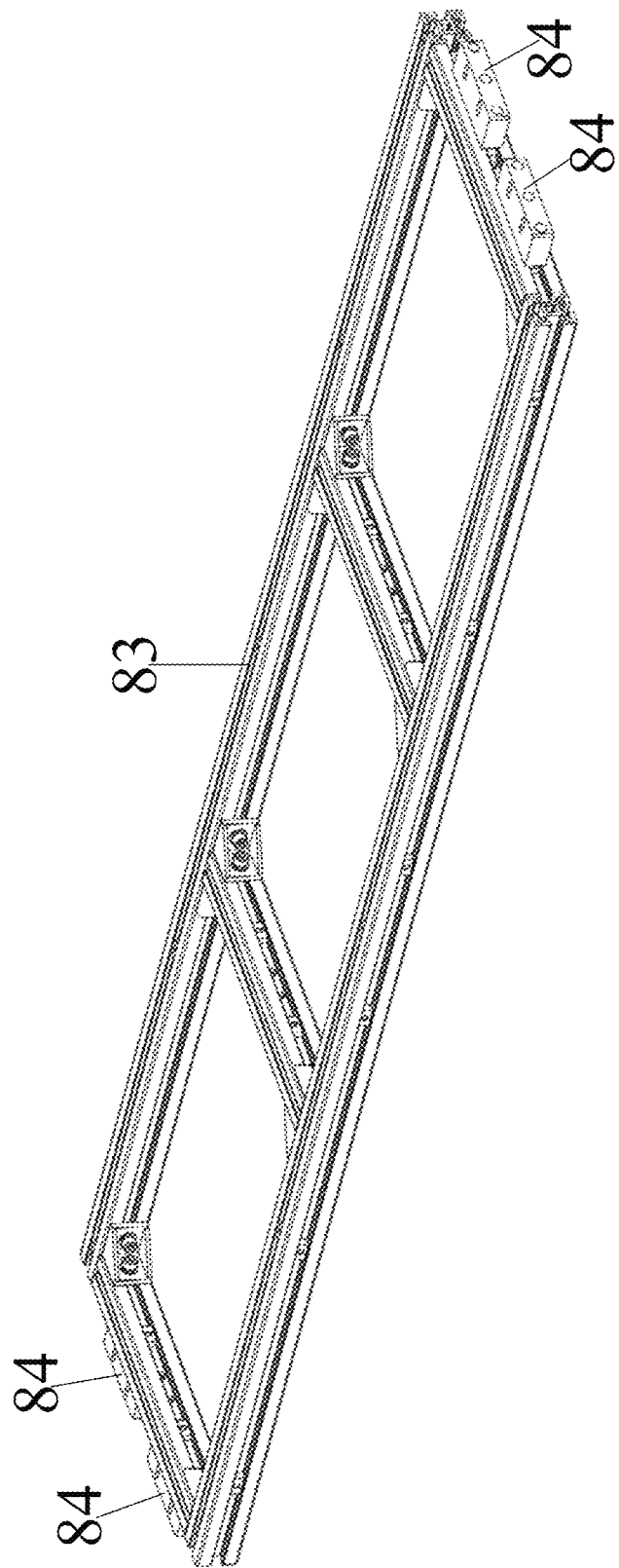
FIG. 15 is a schematic structural diagram showing a support frame of a wafer boat temporary storage apparatus in a semiconductor processing device according to some embodiments of the present disclosure.
Figure 16:
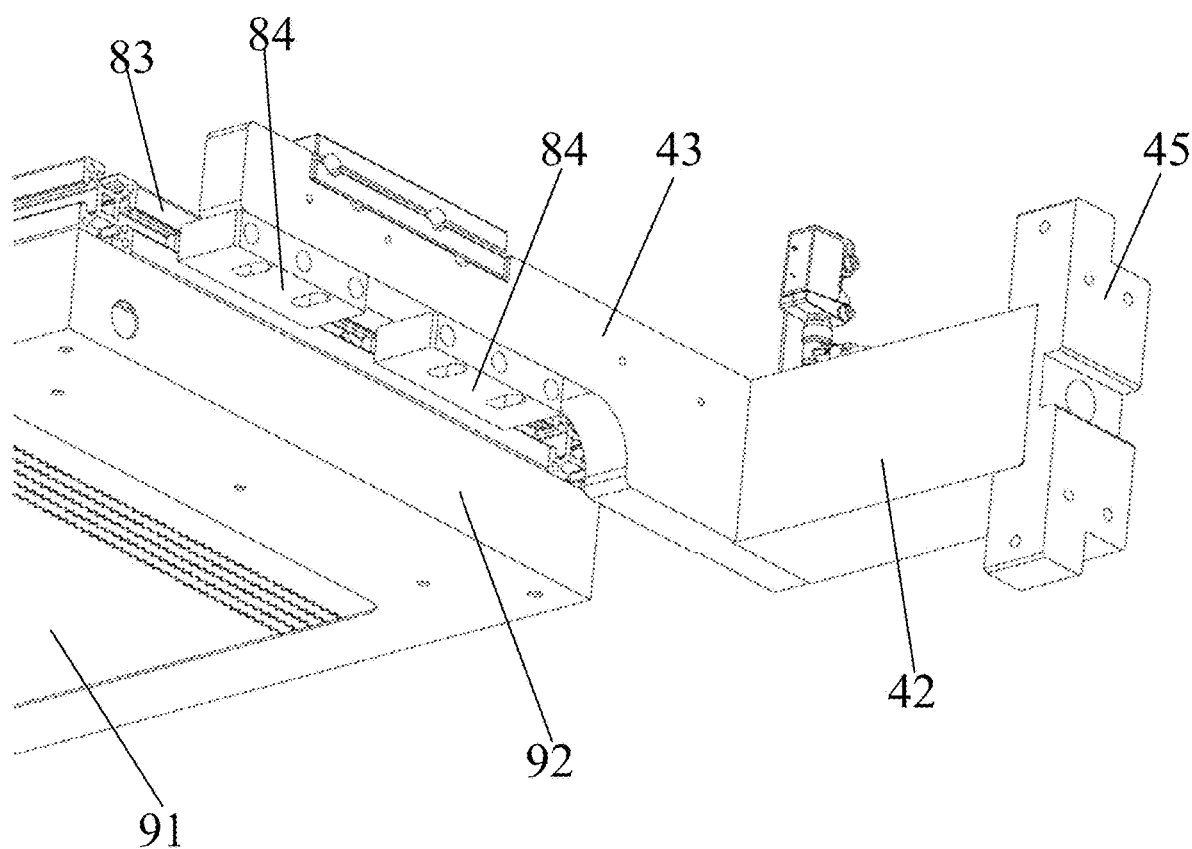
FIG. 16 is a schematic structural diagram showing a support frame connecting to a second support plate through a second connection component in a wafer boat temporary storage apparatus in a semiconductor processing device according to some embodiments of the present disclosure.

In some embodiments, as shown in FIGS. 15 and 16, second connection parts 84 may be provided at both ends of the second support frame 83 in the length direction, and the second connection parts 84 may be connected to the second support plates 43.

As such, the second support frame 83 may be connected to the second support plate 43 through the second connection part 84, such that the liquid cooling part 9, the air cooling part, and the filter part 7 may be connected to the second support plate 43.

Figure 17:
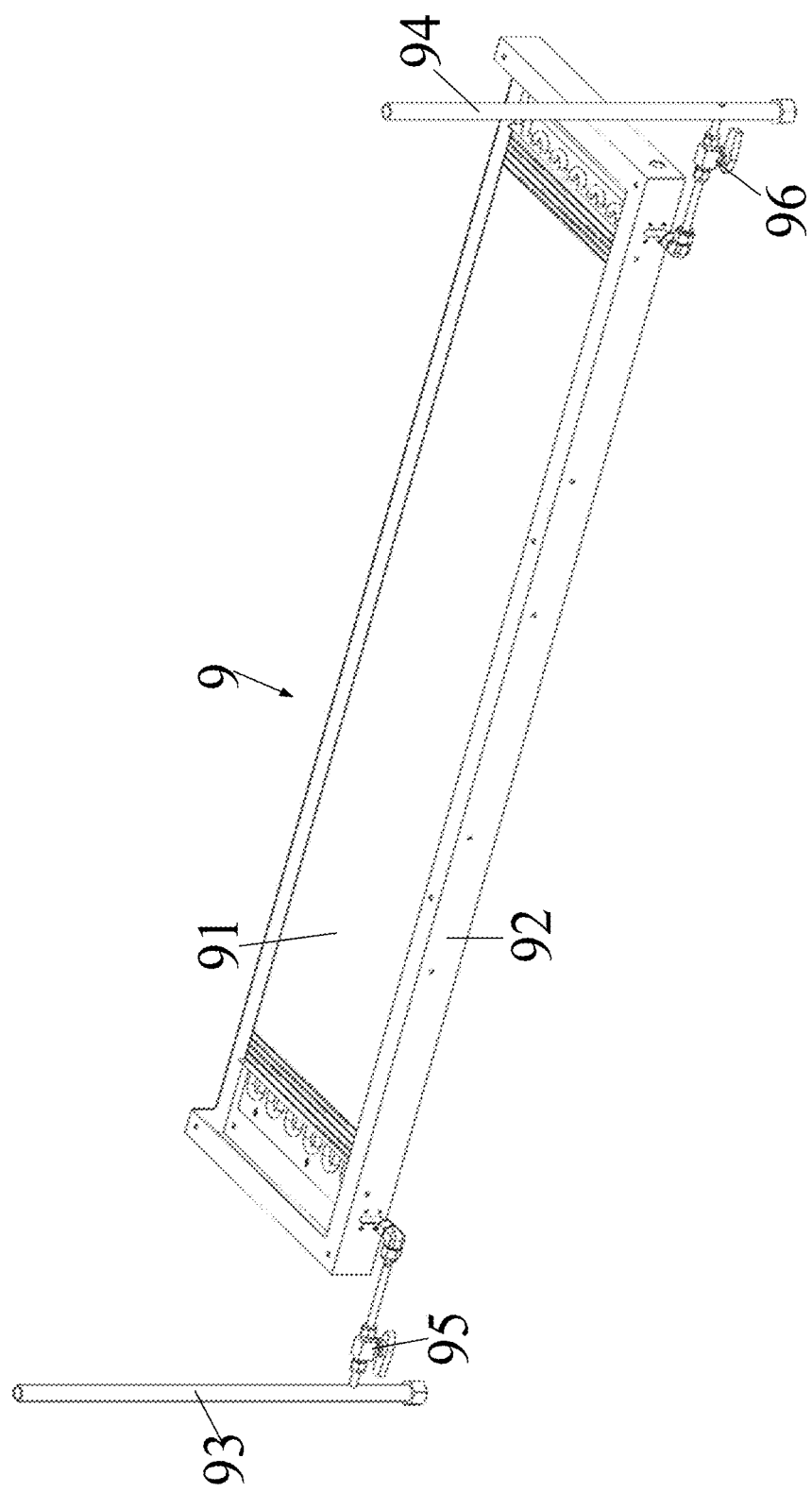
FIG. 17 is a schematic structural diagram showing a liquid cooling component in a wafer boat temporary storage apparatus in a semiconductor processing device according to some embodiments of the present disclosure.

In some embodiments, as shown in FIGS. 12 and 17, the liquid cooling part 9 may include a liquid cooling body 91, a liquid cooling bracket 92, a liquid inlet pipe 93, and a liquid outlet pipe 94. The liquid cooling body 91 and the liquid cooling bracket 92 are connected. The liquid inlet pipe 93 is connected to the liquid cooling body 91 for supplying or transporting a cooling liquid to the liquid cooling body 91. The liquid outlet pipe 94 is connected to the liquid cooling body 91 for draining a heated cooling liquid from the liquid cooling body 91.

The liquid inlet pipe 93 transports the cooling liquid into the liquid cooling body 91. The cooling liquid exchanges heat with the ambient air around the liquid cooling body 91 in the liquid cooling body 91. During a heat exchange process of the cooling liquid and the ambient air around the liquid cooling body 91, the heat of the ambient air around the liquid cooling body 91 may cause the cooling liquid to heat up. The heated cooling liquid may no longer cool the ambient air around the liquid cooling body 91 and may discharge through the liquid outlet pipe 94 from the liquid cooling body 91. The liquid inlet pipe 93 may continuously transport the cooling liquid into the liquid cooling body 91, such that the cooling liquid in the liquid cooling body 91 can continue to exchange heat with the ambient air around the liquid cooling body 91, and continuously cools the ambient air around the liquid cooling body 91.

In some embodiments, as shown in FIG. 4, the liquid cooling bracket 92 may be connected to the second support frame 83 and located under the second support frame 83.

In some embodiments, as shown in FIGS. 4, 12, and 17, the liquid cooling part 9 may further include a liquid inlet on-off valve 95 and a liquid outlet on-off valve 96. The inlet liquid on-off valve 95 is disposed on the liquid inlet pipe 93 to control the opening and closing of the liquid inlet pipe 93. The liquid outlet on-off valve 96 is disposed on the liquid outlet pipe 94 to control the opening and closing of the liquid outlet pipe 94.

According to the actual situations, the liquid inlet on-off valve 95 may be used to control the opening and closing of the liquid inlet pipe 93 to control whether the cooling liquid is transported to the liquid cooling body 91 through the liquid inlet pipe 93, and the liquid outlet on-off valve 96 may be used to control the opening and closing of the liquid outlet pipe 94 to control whether the cooling liquid in the liquid cooling body 91 is discharged through the liquid outlet pipe 94.

In some embodiments, the liquid inlet on-off valve 95 may include a ball valve.

In some embodiments, the liquid outlet on-off valve 96 may include a ball valve.

The present disclosure also provides a semiconductor processing device. The semiconductor processing device includes a wafer boat temporary storage device provided by the embodiments of the present disclosure. The wafer boat temporary storage device is used to temporarily store the wafer boat 01.

The semiconductor processing device provided by the embodiments of the present disclosure may temporarily store the wafer boat 01 through the wafer boat temporary storage device provided by the embodiments of the present disclosure, thereby reducing the contamination on the wafer, and improving the cleanliness of the wafer.

Further, the wafer boat temporary storage device and the semiconductor processing device provided by the embodiments of the present disclosure may reduce the contamination on the wafer and improve the cleanliness of the wafer.

It should be understood that the above embodiments are merely exemplary embodiments for illustrating the principles of the present disclosure, but the present disclosure is not limited thereto. For those of ordinary skill in the art, various modifications and improvements can be made without departing from the spirit and essence of the present disclosure, and these modifications and improvements are also regarded as within the scope of the present disclosure.

What is claimed is:

1. A wafer boat temporary storage device for temporarily storing a wafer boat in a semiconductor processing device, comprising:
   two carrying platforms arranged oppositely and configured to carry two ends of the wafer boat in a length direction of the wafer boat, respectively;
   wherein:
      the wafer boat includes two positioning parts arranged at two ends in the length direction and spaced apart in a width direction of the wafer boat;
      each carrying platform includes a first positioning structure and a second positioning structure;
      the first positioning structure is configured to make rolling contact with two sides of the two positioning parts at one end of the wafer boat that face toward or away from the two positioning parts at the other end of the wafer boat in the length direction to perform alignment between the wafer boat and the wafer boat temporary storage device in the length direction; and
      the second positioning structure is configured to make rolling contact with two sides of the two positioning parts at one end of the wafer boat that face toward or away from each other in the length direction to perform alignment between the wafer boat and the wafer boat temporary storage device in the width direction;
   wherein:
      the wafer boat temporary storage device further includes a liquid cooling part, an air cooling part, and a filter part;
      the liquid cooling part is used to cool ambient air;
      the air cooling part is arranged closer to the carrying platforms than the liquid cooling part, and is used to blow the ambient air cooled by the liquid cooling part to the wafer boat carried on the carrying platforms;
      the filter part is disposed between the liquid cooling part and the air cooling part to filter the ambient air blown by the air cooling part to the wafer boat carried on the carrying platforms;
      the air cooling part includes a fan and a first support frame;
      the fan is disposed above the first support frame for blowing the ambient air cooled by the liquid cooling part toward the wafer boat carried on the carrying platforms;
      the first support frame includes an accommodation slot under the first support frame for accommodating the filter part;
      the first support frame includes ventilation vents connected to the fan and the accommodation slot respectively; and
      the accommodation slot is configured for retrieving the filter part.

2. The wafer boat temporary storage device according to claim 1, wherein:
   in a direction in which the two carrying platforms face toward each other, a distance between the two first positioning structures is smaller than a distance between two second positioning structures;

the first positioning structure is configured to make rolling contact with two sides of the two positioning parts at one end of the wafer boat that face toward the two positioning parts at the other end of the wafer boat in the length direction; and the second positioning structure is configured to make rolling contact with two sides of the two positioning parts at one end of the wafer boat that face toward each other in the length direction.

3. The wafer boat temporary storage device according to claim 1, wherein:

the first positioning structure includes two first rollers arranged apart in a direction perpendicular to the direction in which the two carrying platforms face toward each other; and the two first rollers are rotatably connected to the carrying platform around the direction perpendicular to the direction in which the two carrying platforms face toward each other to make respective rolling contact with the two sides of the two positioning parts at one end of the wafer boat that face toward or away from the two positioning parts at the other end of the wafer boat in the length direction.

4. The wafer boat temporary storage device according to claim 3, wherein:

the first positioning structure further includes two first connection parts and two first rotation shafts;

the two first connection parts are connected to the carrying platforms and are arranged apart in the direction perpendicular to the direction in which the two carrying platforms face toward each other;

the two first rotation shafts are arranged to penetrate the two first connection parts, and an axial direction of each first rotation shaft is perpendicular to the direction in which the two carrying platforms face toward each other; and the two first rollers are rotatably around axes of the two first rotation shafts and sleeved on the two first rotation shafts respectively.

5. The wafer boat temporary storage device according to claim 1, wherein:

the second positioning structure includes two second rollers arranged apart in the direction perpendicular to the direction in which the two carrying platforms face toward each other; and the two second rollers are rotatably connected to the carrying platform around the direction parallel to the direction in which the two carrying platforms face toward each other to make respective rolling contact with the two sides of the two positioning parts at one end of the wafer boat that face toward or away from each other in the length direction.

6. The wafer boat temporary storage device according to claim 5, wherein:

the second positioning structure further includes two second connection parts and two second rotation shafts;

the two second connection parts are connected to the carrying platforms and are arranged apart in the direction perpendicular to the direction in which the two carrying platforms face toward each other; and the two second rotation shafts are arranged to penetrate the two second connection parts, and an axial direction of each second rotation shaft is parallel to the direction in which the two carrying platforms face toward each other; and the two second rollers are rotatably around axes of the two second rotation shafts and sleeved on the two second rotation shafts respectively.

7. The wafer boat temporary storage device according to claim 6, wherein:

each carrying platform includes a first threaded connection hole;

each second connection part includes a long connection hole;

a long axis of the long connection hole is perpendicular to the direction in which the two carrying platforms face toward each other;

the second positioning structure further includes a first threaded connection part;

the first threaded connection part passes through the connection long hole and is threadedly connected to the first threaded connection hole; and the first threaded connection part adjusts its relative position with the corresponding carrying platform in the direction perpendicular to the direction in which the two carrying platforms face toward each other by adjusting its relative position with the long connection hole in the long axis direction.

8. The wafer boat temporary storage device according to claim 1, further comprising:

two first support columns;

two first support plates; and two second support plates;

wherein:

axes of the two first support columns are parallel with each other;

the two first support plates are respectively connected to the two first support columns;

axes of the two first support plates that are perpendicular to surfaces of the two first support plates are perpendicular to the axes of the two first support columns respectively;

the two second support plates are respectively connected to the two first support plates;

axes of the two second support plates that are perpendicular to surfaces of the two second support plates are perpendicular to the axes of the two first support plates that are perpendicular to the surfaces of the two first support plates respectively, and are perpendicular to axes of the first support columns respectively; and the two carrying platforms are respectively connected to the two second support plates.

9. The wafer boat temporary storage device according to claim 8, further comprising:

an adjustment shaft;

a first fixing part; and a second fixing part;

wherein:

the first fixing part is connected to the second support plate, and is detachably connected to the second fixing part;

the first fixing part and the second fixing part include a first groove and a second groove respectively;

the first groove and the second groove are coordinated to form an adjustment hole;

an axial direction of the adjustment hole is parallel to the direction in which the two carrying platforms face toward each other;

the adjustment shaft is connected to the corresponding carrying platform, and penetrates the adjustment hole; and the adjustment shaft adjusts a distance between the two carrying platforms by adjusting its relative position with the adjustment hole in the direction parallel to the direction in which the two carrying platforms face toward each other.

10. The wafer boat temporary storage device according to claim 8, further comprising:
   a detection part disposed at the first support plate and is used to detect whether any wafer boat is carried on the carrying platforms; and
   a preset heat insulation distance is provided between the detection part and the wafer boat carried on the carrying platforms.

11. The wafer boat temporary storage device according to claim 1, wherein:
   a height difference compensator is configured on the carrying platforms;
   the height difference compensator is disposed on one of the carrying platforms; and
   an upper surface of the height difference compensator is higher than an upper surface of the carrying platform.

12. The wafer boat temporary storage device according to claim 1, wherein:
   the number of fans is multiple, multiple fans are divided into multiple fan groups, and each fan group includes at least one fan;
   the number of first support frames is also multiple, the air cooling part also include a second support frame, and multiple fan groups are arranged on multiple first support frames in one-to-one correspondence; and
   the second support frame includes multiple installation spaces for installing multiple first support frames inside in one-to-one correspondence.

13. The wafer boat temporary storage device according to claim 1, wherein:
   the air cooling part also includes a fan protection part;
   the fan protection part covers the top of the fan; and
   the fan protection part includes exposure openings for exposing the fans.

14. The wafer boat temporary storage device according to claim 1, wherein:
   the liquid cooling part includes a liquid cooling body, a liquid cooling bracket, a liquid inlet pipe, and a liquid outlet pipe;
   the liquid cooling body and the liquid cooling bracket are connected;
   the liquid inlet pipe is connected to the liquid cooling body for supplying a cooling liquid to the liquid cooling body; and
   the liquid outlet pipe is connected to the liquid cooling body for draining a heated cooling liquid from the liquid cooling body.

15. A semiconductor processing device, comprising a wafer boat temporary storage device, wherein the wafer boat temporary storage device for temporarily storing a wafer boat includes:
   two carrying platforms arranged oppositely and configured to carry two ends of the wafer boat in a length direction of the wafer boat, respectively;
   wherein:
      the wafer boat includes two positioning parts arranged at two ends in the length direction and spaced apart in a width direction of the wafer boat;
      each carrying platform includes a first positioning structure and a second positioning structure;
      the first positioning structure is configured to make rolling contact with two sides of the two positioning parts at one end of the wafer boat that face toward or away from the two positioning parts at the other end of the wafer boat in the length direction to perform alignment between the wafer boat and the wafer boat temporary storage device in the length direction; and
      the second positioning structure is configured to make rolling contact with two sides of the two positioning parts at one end of the wafer boat that face toward or away from each other in the length direction to perform alignment between the wafer boat and the wafer boat temporary storage device in the width direction;
   wherein:
      the wafer boat temporary storage device further includes a liquid cooling part, an air cooling part, and a filter part;
      the liquid cooling part is used to cool ambient air;
      the air cooling part is arranged closer to the carrying platforms than the liquid cooling part, and is used to blow the ambient air cooled by the liquid cooling part to the wafer boat carried on the carrying platforms;
      the filter part is disposed between the liquid cooling part and the air cooling part to filter the ambient air blown by the air cooling part to the wafer boat carried on the carrying platforms;
      the air cooling part includes a fan and a first support frame;
      the fan is disposed above the first support frame for blowing the ambient air cooled by the liquid cooling part toward the wafer boat carried on the carrying platforms;
      the first support frame includes an accommodation slot under the first support frame for accommodating the filter part;
      the first support frame includes ventilation vents connected to the fan and the accommodation slot respectively; and
      the accommodation slot is configured for retrieving the filter part.

* * * * *